(12) United States Patent
Cho et al.

(10) Patent No.: US 8,767,475 B2
(45) Date of Patent: Jul. 1, 2014

(54) METHOD OF PROGRAMMING A NONVOLATILE MEMORY DEVICE

(75) Inventors: Yong-Sung Cho, Suwon-si (KR); Nam-hee Lee, Seoul (KR); Sang-Yong Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 114 days.

(21) Appl. No.: 13/546,120

(22) Filed: Jul. 11, 2012

(65) Prior Publication Data

US 2013/0028018 A1  Jan. 31, 2013

(30) Foreign Application Priority Data

Jul. 25, 2011 (KR) .................. 10-2011-0073416

(51) Int. Cl.
*G11C 11/34* (2006.01)
*G11C 16/34* (2006.01)
*G11C 11/56* (2006.01)
*G11C 16/10* (2006.01)

(52) U.S. Cl.
CPC ............ *G11C 16/34* (2013.01); *G11C 16/3431* (2013.01); *G11C 16/3436* (2013.01); *G11C 16/3454* (2013.01); *G11C 11/5628* (2013.01); *G11C 16/10* (2013.01)
USPC ............ 365/185.22; 365/185.03; 365/185.18; 365/185.19

(58) Field of Classification Search
CPC .............. G11C 16/34; G11C 16/3436; G11C 16/3454; G11C 16/3432; G11C 11/5628
USPC .............. 365/185.22, 185.18, 185.19, 185.03
See application file for complete search history.

(56) References Cited

U.S. PATENT DOCUMENTS

| | | | | |
|---|---|---|---|---|
| 7,130,210 B2* | 10/2006 | Bathul et al. | .................. | 365/100 |
| 7,251,158 B2* | 7/2007 | Hsia et al. | ................. | 365/185.03 |
| 7,391,642 B2* | 6/2008 | Gordon et al. | ................. | 365/163 |
| 7,408,804 B2* | 8/2008 | Hemink et al. | .......... | 365/185.14 |
| 7,447,078 B2* | 11/2008 | Li | ............................. | 365/185.21 |
| 7,492,641 B2* | 2/2009 | Hosono et al. | ........... | 365/185.22 |
| 7,499,338 B2* | 3/2009 | Ito | ............................. | 365/185.3 |
| 7,535,766 B2* | 5/2009 | Ito | ............................. | 365/185.22 |
| 7,768,836 B2* | 8/2010 | Li et al. | ..................... | 365/185.22 |
| 7,800,956 B2* | 9/2010 | Lee et al. | ................. | 365/185.22 |
| 7,889,565 B2 | 2/2011 | Yanagidaira et al. | | |
| 7,924,624 B2* | 4/2011 | Kim et al. | ................. | 365/185.22 |

(Continued)

FOREIGN PATENT DOCUMENTS

| | | |
|---|---|---|
| JP | 2009-230784 | 10/2009 |
| KR | 1020090123656 A | 12/2009 |
| KR | 1020100112389 A | 10/2010 |

*Primary Examiner* — Viet Q Nguyen
(74) *Attorney, Agent, or Firm* — Volentine & Whitt, PLLC

(57) ABSTRACT

In method of programming a nonvolatile memory device, multi-bit data are loaded into a plurality of page buffers. Multi-level cells included in a multi-level cell block are programmed to a plurality of intermediate program states including a first intermediate program state and a second intermediate program state which is higher than the first intermediate program state based on the multi-bit data. Whether the multi-level cells are programmed to the plurality of intermediate program states is verified. Cell group information for the first intermediate program state is generated by checking whether a result of the verification for the second intermediate program state satisfies a predetermined criterion. The multi-level cells are programmed to a plurality of target program states corresponding to the multi-bit data based on the cell group information.

12 Claims, 22 Drawing Sheets

(56) References Cited

U.S. PATENT DOCUMENTS

| | | | |
|---|---|---|---|
| 8,120,967 B2 * | 2/2012 | Kang | 365/185.22 |
| 8,472,245 B2 * | 6/2013 | Kim | 365/185.03 |
| 2009/0296466 A1 | 12/2009 | Kim et al. | |
| 2010/0259993 A1 | 10/2010 | Kang | |

* cited by examiner

|  | FIRST PROGRAM | SECOND PROGRAM | THIRD PROGRAM |
|---|---|---|---|
| ⋮ | ⋮ | ⋮ | ⋮ |
| WL3 | ④ | ⋮ | ⋮ |
| WL2 | ② | ⑤ | ⋮ |
| WL1 | ① | ③ | ⑥ |

860

METHOD OF PROGRAMMING A NONVOLATILE MEMORY DEVICE

CROSS-REFERENCE TO RELATED APPLICATIONS

A claim of priority under 35 U.S.C. §119 is made to Korean Patent Application No. 2011-0073416 filed on Jul. 25, 2011 in the Korean Intellectual Property Office (KIPO), the entire content of which is incorporated by reference herein in its entirety.

BACKGROUND

Example embodiments relate to nonvolatile memory devices. More particularly, example embodiments relate to methods of programming multi-level cells of nonvolatile memory devices.

Memory cells of a nonvolatile memory device, such as a flash memory device, may be classified as either single level cells (SLCs) that store one bit of data per memory cell or multi-level cells (MLCs) that store more than one bit of data per memory cell. In the case of MLCs, multiple bits of data may be stored by using multiple threshold voltage distributions to represent different logic states of multi-bit data. For example, two-bit MLCs may use four threshold voltage distributions to represent respective logical states "11", "10", "01" and "00".

To ensure accurate storage of the multi-bit data, the threshold voltage distributions of the MLCs must be separated by adequate sensing margins (or read margins). However, certain characteristic of newer flash memory devices, such as increasing integration density, may cause the threshold voltage distributions to widen due to electrical coupling between adjacent memory cells or a program disturb effect. This can result in reduced sensing margins which can adversely impact device reliability.

SUMMARY

According to example embodiments, in a method of programming a nonvolatile memory device, multi-bit data are loaded into a plurality of page buffers. Multi-level cells included in a multi-level cell block are programmed to a plurality of intermediate program states based on the multi-bit data. The plurality of intermediate program states include a first intermediate program state and a second intermediate program state which is higher than the first intermediate program state. Whether the multi-level cells are programmed to the plurality of intermediate program states is verified. Cell group information for the first intermediate program state is generated by checking whether a result of the verification for the second intermediate program state satisfies a predetermined criterion. The multi-level cells are programmed to a plurality of target program states corresponding to the multi-bit data based on the cell group information.

In some example embodiments, the predetermined criterion may include whether a number of off-cells of the second intermediate program state is greater than a predetermined value.

In some example embodiments, the predetermined criterion may include whether a number of program loops performed after at least one multi-level cell of the second intermediate program state becomes an off-cell is greater than a second predetermined value.

In some example embodiments, the cell group information may represent whether each of the multi-level cells belongs to a fast cell group including multi-level cells of which threshold voltages increase relatively fast and a slow cell group including multi-level cells of which threshold voltages increase relatively slowly.

In some example embodiments, to program the multi-level cells to the plurality of target program states, a first program voltage may be applied to the multi-level cells that belong to the fast cell group, and a second program voltage higher than the first program voltage may be applied to the multi-level cells that belong to the slow cell group.

In some example embodiments, to program the multi-level cells to the plurality of target program states, a voltage of a low level may be applied to bitlines coupled to the multi-level cells that belong to the slow cell group, a forcing voltage higher than the voltage of the low level may be applied to bitlines coupled to the multi-level cells that belong to the fast cell group, and a program voltage may be applied to a selected wordline.

In some example embodiments, to generate the cell group information, off-cells having threshold voltages which are higher than a second intermediate verify voltage among the multi-level cells to be programmed to the second intermediate program state may be counted, and on-cells having threshold voltages which are lower than a first intermediate verify voltage among the multi-level cells to be programmed to the first intermediate program state may be marked as slow cells when a number of the counted off-cells is greater than a predetermined value.

In some example embodiments, to generate the cell group information, off-cells having threshold voltages which are higher than a second intermediate verify voltage among the multi-level cells to be programmed to the second intermediate program state may be counted, and off-cells having threshold voltages which are higher than a first intermediate verify voltage among the multi-level cells to be programmed to the first intermediate program state may be marked as fast cells when a number of the counted off-cells is greater than a predetermined value.

In some example embodiments, to generate the cell group information, off-cells having threshold voltages which are higher than a second intermediate verify voltage among the multi-level cells to be programmed to the second intermediate program state may be counted, and off-cells having threshold voltages which are higher than a first intermediate verify voltage among the multi-level cells to be programmed to the first intermediate program state may be marked as fast cells until a number of the counted off-cells becomes greater than a predetermined value.

In some example embodiments, to generate the cell group information, program loops that are performed after at least one of the multi-level cells to be programmed to the second intermediate program state becomes an off-cell having a threshold voltage which is higher than a second intermediate verify voltage may be counted, and on-cells having threshold voltages which is lower than a first intermediate verify voltage among the multi-level cells to be programmed to the first intermediate program state may be marked as slow cells when a number of the counted program loops is greater than a predetermined value.

In some example embodiments, the multi-bit data provided from a host may be programmed to at least one single level cell block. To load the multi-bit data into the plurality of page buffers, the multi-bit data may be loaded from the at least one single level cell block into the plurality of page buffers.

In some example embodiments, the cell group information may be programmed to the at least one single level cell block, and the multi-bit data and the cell group information may be loaded from the at least one single level cell block into the plurality of page buffers to program the multi-level cells to the plurality of target program states.

According to example embodiments, in a method of programming a nonvolatile memory device, multi-bit data are loaded into a plurality of page buffers. Multi-level cells included in a multi-level cell block are programmed to a plurality of intermediate program states based on the multi-bit data. Whether the multi-level cells are programmed to the plurality of intermediate program states is verified. Cell group information representing to which one of a plurality of groups that each of the multi-level cells belongs is generated by dividing the multi-level cells into the plurality of groups according to a number of program loops performed until each of the multi-level cells is determined to be programmed as a result of the verification. The multi-bit data are programmed to a plurality of target program states corresponding to the multi-bit data based on the cell group information.

In some example embodiments, the plurality of groups may include a first group including first multi-level cells that are determined to be programmed at a first program loop, a second group including second multi-level cells that are determined to be programmed at a second program loop performed after the first program loop, and a third group including third multi-level cells that are determined to be programmed at a third program loop performed after the second program loop. To program the multi-bit data to the plurality of target program states, a first program voltage may be applied to the first multi-level cells that belong to the first group, a second program voltage which is higher than the first program voltage may be applied to the second multi-level cells that belong to the second group, and a third program voltage which is higher than the second program voltage may be applied to the third multi-level cells that belong to the third group.

In some example embodiments, the plurality of groups may include a first group including first multi-level cells that are determined to be programmed at a first program loop, a second group including second multi-level cells that are determined to be programmed at a second program loop performed after the first program loop, and a third group including third multi-level cells that are determined to be programmed at a third program loop performed after the second program loop. To program the multi-bit data to the plurality of target program states, a first forcing voltage may be applied to bitlines coupled to the first multi-level cells that belong to the first group, a second forcing voltage which is lower than the first forcing voltage may be applied to bitlines coupled to the second multi-level cells that belong to the second group, a voltage of a low level which is lower than the second forcing voltage may be applied to bitlines coupled to the third multi-level cells that belong to the third group, and a program voltage may be applied to a selected wordline.

According to example embodiments, a method of programming a nonvolatile memory device may include programming multi-level cells to a plurality of target program states corresponding to the multi-bit data based on previously stored cell group information. The cell group information divides the multi-level cells into a plurality of groups according to a number of program loops previously performed until each of the multi-level cells is determined to be programmed to at least one intermediate program state. Programming voltage conditions applied to the multi-level cells during programming to the plurality of target states are different for each of the groups.

In some example embodiments, programming the multi-level cells to the plurality of target program states may include applying a first program voltage to the first multi-level cells that belong to a first group among the plurality of group, applying a second program voltage which is higher than the first program voltage to the second multi-level cells that belong to a second group among the plurality of groups, and applying a third program voltage which is higher than the second program voltage to the third multi-level cells that belong to a third group among the plurality of groups.

In some example embodiments, programming the multi-level cells to the plurality of target program states may include applying a first forcing voltage to bitlines coupled to the first multi-level cells that belong to a first group among the plurality of groups, applying a second forcing voltage which is lower than the first forcing voltage to bitlines coupled to the second multi-level cells that belong to a second group among the plurality of groups, applying a voltage of a low level which is lower than the second forcing voltage to bitlines coupled to the third multi-level cells that belong to a third group among the plurality of groups, and applying a program voltage to a selected wordline.

In some example embodiments, the method may further include programming the multi-bit data provided from a host to at least one single level cell block, and loading the multi-bit data into a plurality of page buffers from the at least one single level cell block. The cell group information may be stored in the at least one single level cell block, and the method may further include loading the cell group information from the at least one single level cell block into the plurality of page buffers.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
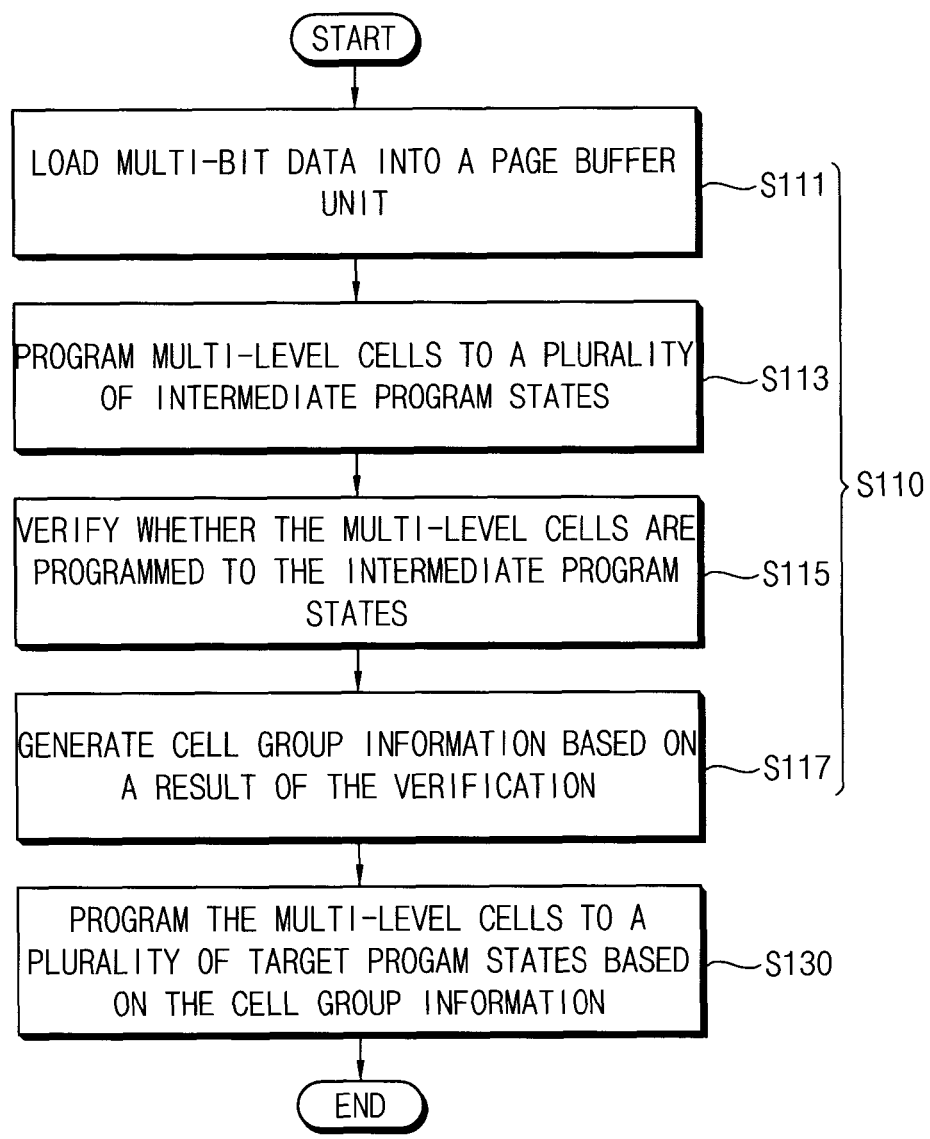
FIG. 1 is a flow chart illustrating a method of programming a nonvolatile memory device according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third and so on. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
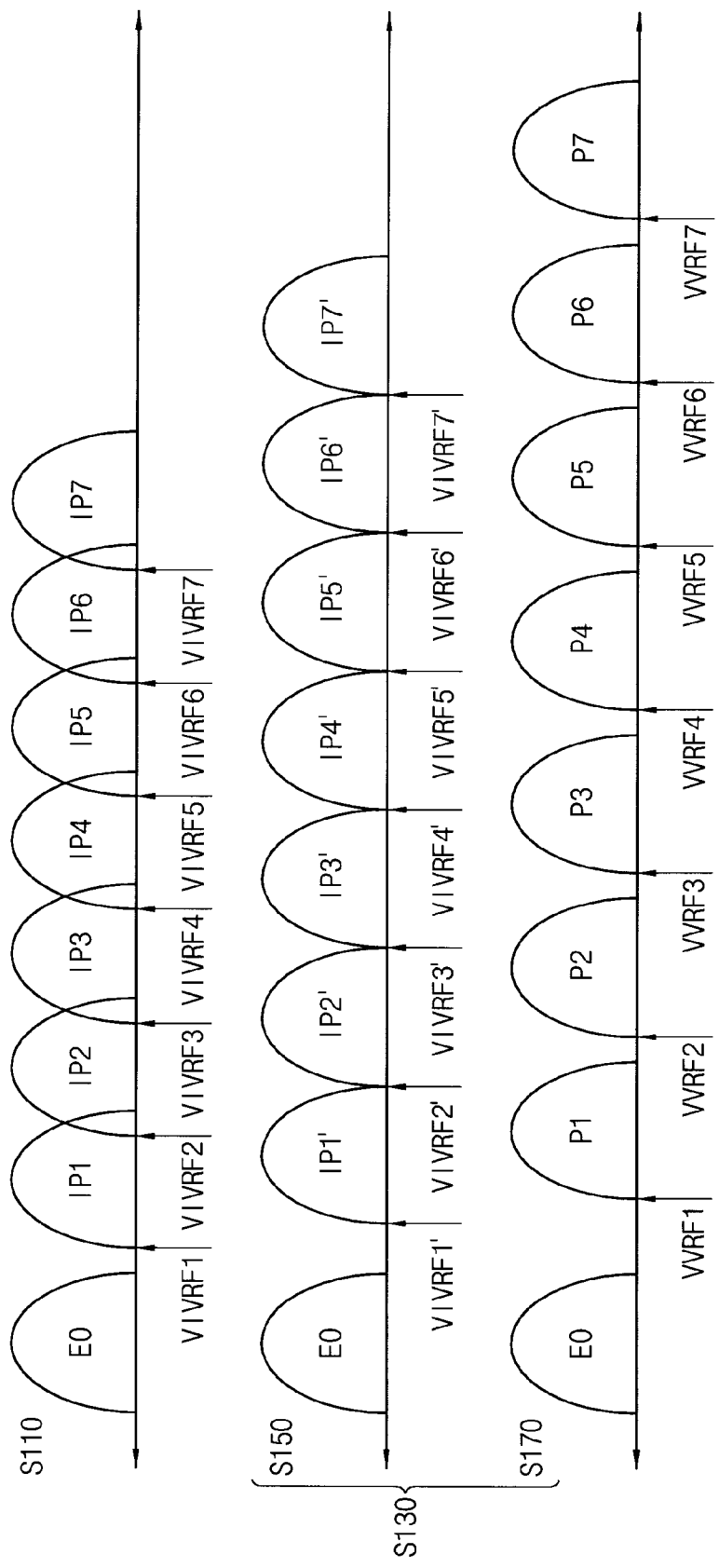
FIG. 2 is a diagram illustrating an example of threshold voltage distributions of multi-levels cells programmed by a program method according to example embodiments.

FIG. 1 is a flow chart illustrating a method of programming a nonvolatile memory device according to example embodiments. FIG. 2 is a diagram illustrating an example of threshold voltage distributions of multi-levels cells programmed by a program method according to example embodiments.

Referring to FIGS. 1 and 2, multi-bit data are loaded into a plurality of page buffers (S111). Each multi-bit data may include two or more bits. In some example embodiments, the multi-bit data may be loaded from at least one single level cell block into the plurality of page buffers. For example, the multi-bit data provided from a host may be loaded into the plurality of page buffers, and the loaded multi-bit data may be programmed to the at least one single level cell block. Thereafter, the programmed multi-bit data may be loaded again from a plurality of pages in the at least one single level cell block into the plurality of page buffers. That is, the at least one single level cell block may serve as a buffer. In other example embodiments, the multi-bit data may not be programmed to a single level cell block or buffer, and may be loaded from the host into the plurality of page buffers via a memory controller.

Multi-level cells included in a multi-level cell block may be programmed to a plurality of intermediate program states IP1, IP2, IP3, IP4, IP5, IP6 and IP7 based on the multi-bit data loaded into the plurality of page buffers (S111). For example, the multi-level cells may be programmed by applying an incremental step pulse to a wordline coupled to the multi-level cells. The incremental step pulse may increase by a predetermined step voltage per program loop.

Whether the multi-level cells are programmed to the plurality of intermediate program states IP1, IP2, IP3, IP4, IP5, IP6 and IP7 may be verified by using a plurality of intermediate verify voltages VIVRF1, VIVRF2, VIVRF3, VIVRF4, VIVRF5, VIVRF6 and VIVRF7 (S115). For example, to perform a verify operation for a first intermediate program state IP1, threshold voltages of the multi-level cells to be programmed to the first intermediate program state IP1 may be compared (e.g., according to an ON-OFF state of the memory cells) with a first intermediate verify voltage VIVRF1 by applying the first intermediate verify voltage VIVRF1 to the multi-level cells. If a multi-level cell is determined to have a threshold voltage higher than the first intermediate verify voltage VIVRF1 as a result of the comparison (e.g., the multi-level cell is OFF), the multi-level cell may be determined to be properly programmed, and the multi-level cell may not be subject to further programming. Similarly, verify operations for second through seventh intermediate program states IP2, IP3, IP4, IP5, IP6 and IP7 may be performed by comparing threshold voltages of the multi-level cells with second through seventh intermediate verify voltages VIVRF2, VIVRF3, VIVRF4, VIVRF5, VIVRF6 and VIVRF7.

During the verify operations, cell group information may be generated based on a result of the verification (S117). In some example embodiments, the cell group information for each intermediate program state (e.g., IP1) may be generated by checking whether the result of the verification for an upper intermediate program state (e.g., IP2) which is higher than the intermediate program state (e.g., IP1) satisfies a predetermined criterion. In some example embodiments, the predetermined criterion may be whether the number of off-cells of the upper intermediate program state is greater than a predetermined value. In other example embodiments, the predetermined criterion may be whether the number of program loops performed after at least one multi-level cell of the upper intermediate program state becomes an off-cell is greater than a predetermined value. The cell group information may represent whether each multi-level cell belongs to which one of a fast cell group including multi-level cells of which threshold voltages increase relatively fast or a slow cell group including multi-level cells of which threshold voltages increase relatively slowly. For example, the cell group information for the first intermediate program state IP1 may be generated by checking whether a result of the verification for the second intermediate program state IP2 satisfies the predetermined criterion. In some example embodiments, when the number of off-cells of the second intermediate program state IP2 becomes greater than the predetermined value, off-cells of the first intermediate program state IP1 may be marked as fast cells, and on-cells of the first intermediate program state IP1 may be marked as slow cells. Accordingly, the cell group information for the first intermediate program state IP1 representing that each multi-level cell of the first intermediate program state IP1 belongs to which one of the fast cell group or the slow cell group may be generated. Similarly, the cell group information for the second through sixth intermediate program states IP2, IP3, IP4, IP5 and IP6 may be generated by checking whether results of the verification for the third through seventh intermediate program states IP3, IP4, IP5, IP6 and IP7 satisfy the predetermined criterion, respectively. The cell group information for the seventh intermediate program state IP7 may be generated based on the number of its off-cells or the number of its program loops.

In other example embodiments, the cell group information representing that each multi-level cell belongs to which one of a plurality of groups by dividing the multi-level cells into the plurality of groups according to the number of program loops performed until each multi-level cell is determined to be programmed as a result of the verification. For example, in a case where a first program operation includes first through eighth program loops, and the plurality of groups include first through fourth groups, multi-level cells determined to be programmed at the first and second program loops (i.e., multi-level cells that becomes off-cells during the first and second program loops) may be marked as the first group, multi-level cells determined to be programmed at the third and fourth program loops may be marked as the second group, multi-level cells determined to be programmed at the fifth and sixth program loops may be marked as the third group, and multi-level cells determined to be programmed at the seventh and eighth program loops may be marked as the fourth group. Accordingly, the cell group information representing to which one of the first through fourth groups that each multi-level cell belongs may be generated.

The first program operation may be performed by performing the data loading (S111), the application of the program voltage (S113), the program verification (S115) and the generation of the cell group information (S117). The application of the program voltage (S113) and the program verification (S115) may be repeatedly performed until all the multi-level cells are determined to be programmed to the plurality of intermediate program states IP1, IP2, IP3, IP4, IP5, IP6 and IP7 as a result of the program verification (S115). The generation of the cell group information (S117) may be performed during the program verification (S115). Further, the generation of the cell group information (S117) may be performed using the result of the program verification (S115)

without application of an additional verify voltage or an additional voltage for classifying groups.

In some example embodiments, the cell group information generated by the first program operation may be stored and retained in latches included in the plurality of page buffers. In other example embodiments, the cell group information generated by the first program operation may be programmed to the at least one single level cell block. In this case, the cell group information may be programmed to the at least one single level cell block, and may be loaded from the at least one single level cell block into the plurality of page buffers when the multi-level cells are programmed to a plurality of target program states P1, P2, P3, P4, P5, P6 and P7.

The multi-level cells having the plurality of intermediate program states IP1, IP2, IP3, IP4, IP5, IP6 and IP7 may be programmed to the plurality of target program states P1, P2, P3, P4, P5, P6 and P7 based on the cell group information (S130). In some example embodiments, to program the multi-level cells to the plurality of target program states P1, P2, P3, P4, P5, P6 and P7, a second program operation (S150) and a third program operation (S170) may be performed.

By the second program operation (S150), the multi-level cells having the plurality of intermediate program states IP1, IP2, IP3, IP4, IP5, IP6 and IP7 may be programmed to a plurality of intermediate program states IP1', IP2', IP3', IP4', IP5', IP6' and IP7' by using a plurality of intermediate verify voltages VIVRF1', VIVRF2', VIVRF3', VIVRF4', VIVRF5', VIVRF6' and VIVRF7'. The plurality of intermediate verify voltages VIVRF1', VIVRF2', VIVRF3', VIVRF4', VIVRF5', VIVRF6' and VIVRF7' of the second program operation (S150) may have voltage levels higher than those of the plurality of intermediate verify voltages VIVRF1, VIVRF2, VIVRF3, VIVRF4, VIVRF5, VIVRF6 and VIVRF7 of the first program operation (S110), respectively.

By the third program operation (S170), the multi-level cells having the plurality of intermediate program states IP1', IP2', IP3', IP4', IP5', IP6' and IP7' may be programmed to the plurality of target program states P1, P2, P3, P4, P5, P6 and P7 by using a plurality of verify voltages VVRF1, VVRF2, VVRF3, VVRF4, VVRF5, VVRF6 and VVRF7. The plurality of verify voltages VVRF1, VVRF2, VVRF3, VVRF4, VVRF5, VVRF6 and VVRF7 of the third program operation (S170) may have voltage levels higher than those of the plurality of intermediate verify voltages VIVRF1', VIVRF2', VIVRF3', VIVRF4', VIVRF5', VIVRF6' and VIVRF7' of the second program operation (S150), respectively.

According to example embodiments, logic values of the multi-bit data may be assigned to the plurality of target program states P1, P2, P3, P4, P5, P6 and P7 in a variety of different manners by considering the number of read voltages applied during a read operation, a bit-error rate, a bit-error distribution, and so on. For example, logic values "111", "011", "001", "101", "100", "000", "010" and "110" may be assigned to the plurality of target program states P1, P2, P3, P4, P5, P6 and P7, respectively.

The second program operation (S150) and the third program operation (S170) may be performed based on the cell group information. In some example embodiments, during the second program operation (S150) and/or the third program operation (S170), different program voltages may be applied according to the plurality of groups indicated by the cell group information. For example, a first program voltage may be applied to the multi-level cells that belong to the fast cell group, and a second program voltage higher than the first program voltage may be applied to the multi-level cells that belong to the slow cell group. Accordingly, each target program state P1, P2, P3, P4, P5, P6 and P7 may have a relatively narrow threshold voltage distribution. In other examples, a first program voltage may be applied to the multi-level cells that belong to the first group, a second program voltage higher than the first program voltage may be applied to the multi-level cells that belong to the second group, a third program voltage higher than the second program voltage may be applied to the multi-level cells that belong to the third group, a fourth program voltage higher than the third program voltage may be applied to the multi-level cells that belong to the fourth group. Accordingly, a program time of the second program operation (S150) and/or the third program operation (S170) may be reduced.

In other example embodiments, during the second program operation (S150) and/or the third program operation (S170), different bitline voltages may be applied according to the plurality of groups indicated by the cell group information. For example, a voltage of a low level (e.g., a ground voltage) may be applied to bitlines coupled to multi-level cells that belong to the slow cell group, and a forcing voltage higher than the voltage of the low level may be applied to bitlines coupled to multi-level cells that belong to the fast cell group. Accordingly, each target program state P1, P2, P3, P4, P5, P6 and P7 may have a narrow width. In other examples, a first forcing voltage may be applied to bitlines coupled to multi-level cells that belong to the first group, a second forcing voltage lower than the first voltage may be applied to bitlines coupled to multi-level cells that belong to the second group, a third forcing voltage lower than the second forcing voltage may be applied to bitlines coupled to multi-level cells that belong to the third group, and the voltage of the low level lower than the third forcing voltage may be applied to bitlines coupled to multi-level cells that belong to the fourth group. Accordingly, a program time of the second program operation (S150) and/or the third program operation (S170) may be reduced.

As described above, in the method of programming the nonvolatile memory device according to example embodiments, the cell group information may be generated based on the result of the program verification (S115) during the first program operation (S110), and the second program operation (S150) and/or the third program operation (S170) may be performed based on the cell group information. Accordingly, each target program state P1, P2, P3, P4, P5, P6 and P7 may have a relatively narrow threshold voltage distribution, and the program time of the second program operation (S150) and/or the third program operation (S170) may be reduced.

Although FIG. 2 illustrates an example of multi-level cells of which each stores data of three bits, the method of programming the nonvolatile memory device according to example embodiments may be applied to multi-level cells of which each stores data of two or more bits.

Figure 3:
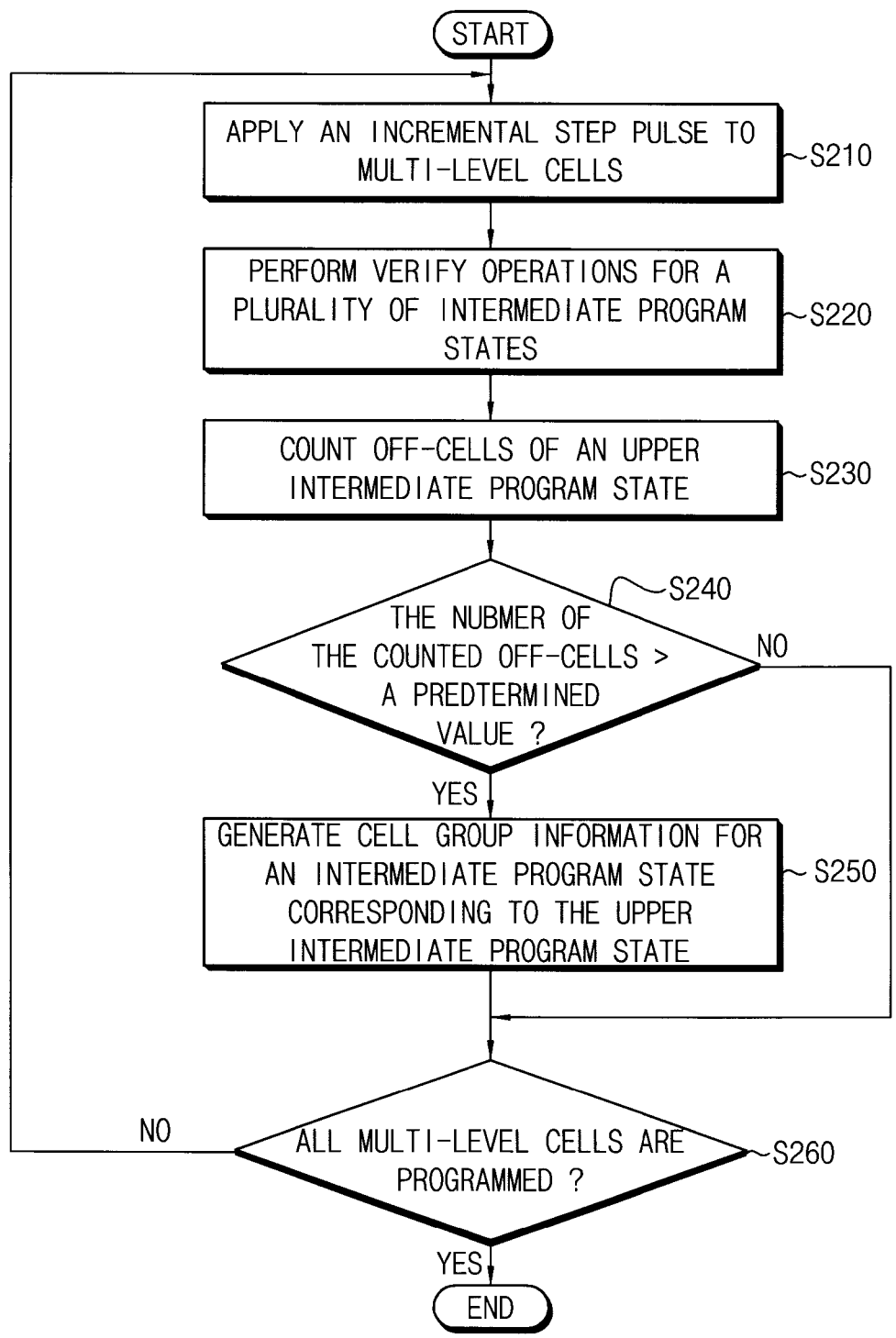
FIG. 3 is a flow chart illustrating a first program operation of a program method according to example embodiments.
Figure 4:
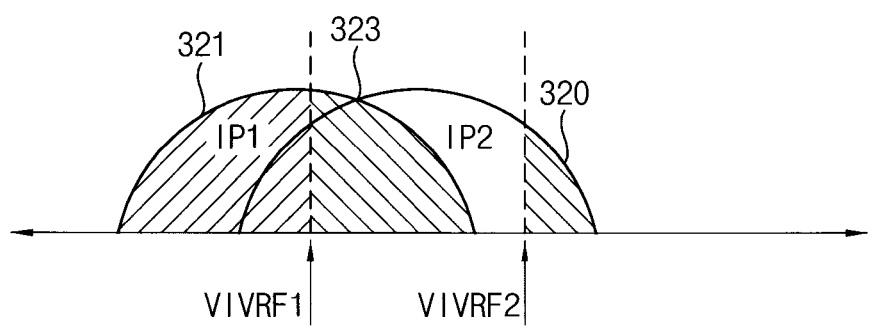
FIG. 4 is a diagram illustrating an example of generating cell group information for a first intermediate program state during a first program operation illustrated in FIG. 3.
Figure 5:
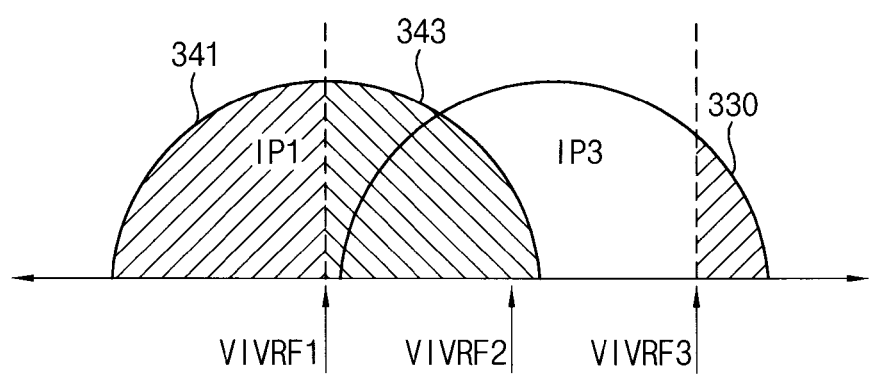
FIG. 5 is a diagram illustrating another example of generating cell group information for a first intermediate program state during a first program operation illustrated in FIG. 3.

FIG. 3 is a flow chart illustrating a first program operation of a program method according to example embodiments. FIG. 4 is a diagram illustrating an example of generating cell group information for a first intermediate program state during a first program operation illustrated in FIG. 3. FIG. 5 is a diagram illustrating another example of generating cell group information for a first intermediate program state during a first program operation illustrated in FIG. 3.

Referring to FIGS. 2 and 3, a program voltage may be applied to multi-level cells included in a multi-level cell block (S210). The program voltage may be an incremental step pulse that increases by a predetermined step voltage per program loop.

After the program voltage is applied, verify operations for first through seventh intermediate program states IP1, IP2, IP3, IP4, IP5, IP6 and IP7 may be sequentially performed (S220). For example, a verify operation for a first intermediate program state IP1 may be performed by using a first intermediate verify voltage VIVRF1, and then a verify operation for a second intermediate program state IP2 may be performed by using a second intermediate verify voltage VIVRF2. Thereafter, verify operations for third through seventh intermediate program states IP3, IP4, IP5, IP6 and IP7 may be sequentially performed by using third through seventh intermediate verify voltages VIVRF3, VIVRF4, VIVRF5, VIVRF6 and VIVRF7.

To generate cell group information for each intermediate program state (S250), while (or substantially directly after) a verify operation for an upper intermediate program state (e.g., IP2) corresponding to each intermediate program state (e.g., IP1) is performed (S220), off-cells of the upper intermediate program state may be counted (S230). The number of the counted off-cells of the upper intermediate program state (or a ratio of the counted off-cells to multi-level cells of the upper intermediate program state) may be compared with a predetermined value (S240).

If the number of the counted off-cells of the upper intermediate program state is less than or equal to the predetermined value (S240: NO), the cell group information for the intermediate program state corresponding to the upper intermediate program state may not be generated, and a subsequent verify operation for an intermediate program state higher than the upper intermediate program state may be performed (S220). After the verify operations for all of the intermediate program states IP1, IP2, IP3, IP4, IP5, IP6 and IP7 are performed, a subsequent program loop may be performed unless all multi-level cells are determined to be programmed during the verify operations (S260: NO). Thus, the incremental step pulse may increase by a predetermined step pulse, and may be applied again to the multi-level cells (S210).

If the number of the counted off-cells of the upper intermediate program state is greater than the predetermined value (S240: YES), the cell group information for the intermediate program state (e.g., IP1) corresponding to the upper intermediate program state (e.g., IP2) may be generated (S250). The cell group information may represent to which one of a fast cell group or a slow cell group each multi-level cell of the intermediate program state belongs.

In some example embodiments, as illustrated in FIG. 4, at a program loop when the number of counted off-cells 320 of a second intermediate program state IP2 (i.e., the number of multi-level cells of the second intermediate program state IP2 having threshold voltages higher than the second intermediate verify voltage VIVRF2) becomes greater than the predetermined value (or at the next program loop), off-cells 323 of the first intermediate program state IP1 (i.e., multi-level cells of the first intermediate program state IP1 having threshold voltages higher than a first intermediate verify voltage VIVRF1) may be marked as fast cells, and on-cells 321 of the first intermediate program state IP1 (i.e., multi-level cells of the first intermediate program state IP1 having threshold voltages lower than the first intermediate verify voltage VIVRF1) may be marked as slow cells. Accordingly, the cell group information representing to which one of the fast cell group or the slow cell group that each multi-level cell of the first intermediate program state IP1 belongs may be generated (S250). For example, the multi-level cells of the first intermediate program state IP1 having threshold voltages lower than the first intermediate verify voltage VIVRF1 (i.e., the on-cells of the first intermediate program state IP1) may be marked with "1". In other examples, the multi-level cells of the first intermediate program state IP1 having threshold voltages higher than the first intermediate verify voltage VIVRF1 (i.e., the off-cells of the first intermediate program state IP1) may be marked with "1".

Similarly, If the number of the counted off-cells of each of the third through seventh intermediate program states IP3, IP4, IP5, IP6 and IP7 is greater than the predetermined value (S240: YES), the cell group information for corresponding one of the second through sixth intermediate program states IP2, IP3, IP4, IP5 and IP6 may be generated (S250). The cell group information for the seventh intermediate program state IP7 may be generated by comparing the number of its off-cells with another predetermined value. As described above, the cell group information for the first through seventh intermediate program states IP1, IP2, IP3, IP4, IP5, IP6 and IP7 may be generated using the first through seventh intermediate verify voltages VIVRF1, VIVRF2, VIVRF3, VIVRF4, VIVRF5, VIVRF6 and VIVRF7 without application of an additional verify voltage or an additional voltage for classifying groups. Accordingly, the generation of the cell group information may not substantially increase a program time. Further, since the multi-level cells are classified as the fast cell group or the slow cell group by using the intermediate verify voltages VIVRF1, VIVRF2, VIVRF3, VIVRF4, VIVRF5, VIVRF6 and VIVRF7 close to target verify voltages VVRF1, VVRF2, VVRF3, VVRF4, VVRF5, VVRF6 and VVRF7, the cell group information may be accurate.

In other example embodiments, as illustrated in FIG. 5, at a program loop when the number of counted off-cells 330 of the third intermediate program state IP3 becomes greater than the predetermined value (or at the next program loop), off-cells 343 of the first intermediate program state IP1 may be marked as the fast cells, and on-cells 341 of the first intermediate program state IP1 may be marked as the slow cells. Accordingly, the cell group information representing to which one of the fast cell group or slow cell that each multi-level cell of the first intermediate program state IP1 belongs may be generated (S250).

Similarly, if the number of the counted off-cells of each of the fourth through seventh intermediate program states IP4, IP5, IP6 and IP7 is greater than the predetermined value (S240: YES), the cell group information for corresponding one of the second through fifth intermediate program states IP2, IP3, IP4 and IP5 may be generated (S250). The cell group information for the sixth and seventh intermediate program states IP6 and IP7 may be generated by comparing the numbers of those off-cells with other predetermined values. Accordingly, accurate cell group information may be generated without increasing the program time.

Although FIG. 4 illustrates an example where the cell group information for each intermediate program state (e.g., IP1) is generated by checking whether a result of verification for an upper intermediate program state (e.g., IP2) that is one state higher than the intermediate program state (e.g., IP1) satisfies the predetermined criterion, and FIG. 5 illustrates an example where the cell group information for each intermediate program state (e.g., IP1) is generated by checking whether a result of verification for an upper intermediate program state (e.g., IP3) that is two states higher than the intermediate program state (e.g., IP1) satisfies the predetermined criterion, according to example embodiments, the cell group information for each intermediate program state may be generated by checking whether a result of verification for any upper intermediate program state satisfies the predetermined criterion. In some example embodiments, the upper intermediate program state corresponding to each intermediate program state may be determined according to a width of each threshold voltage distribution, an interval between intermediate verify voltages, and so on.

If all multi-level cells are determined to be programmed during the verify operations (S260: YES), a first program operation may be completed. As described above, during the first program operation of the program method according to example embodiments, the multi-level cells of each intermediate program state may be divided into the fast cell group and the slow cell group at the program loop when the number of the off-cells of a corresponding upper intermediate program state becomes greater than the predetermined value, thereby accurately and rapidly generating the cell group information.

Figure 6:
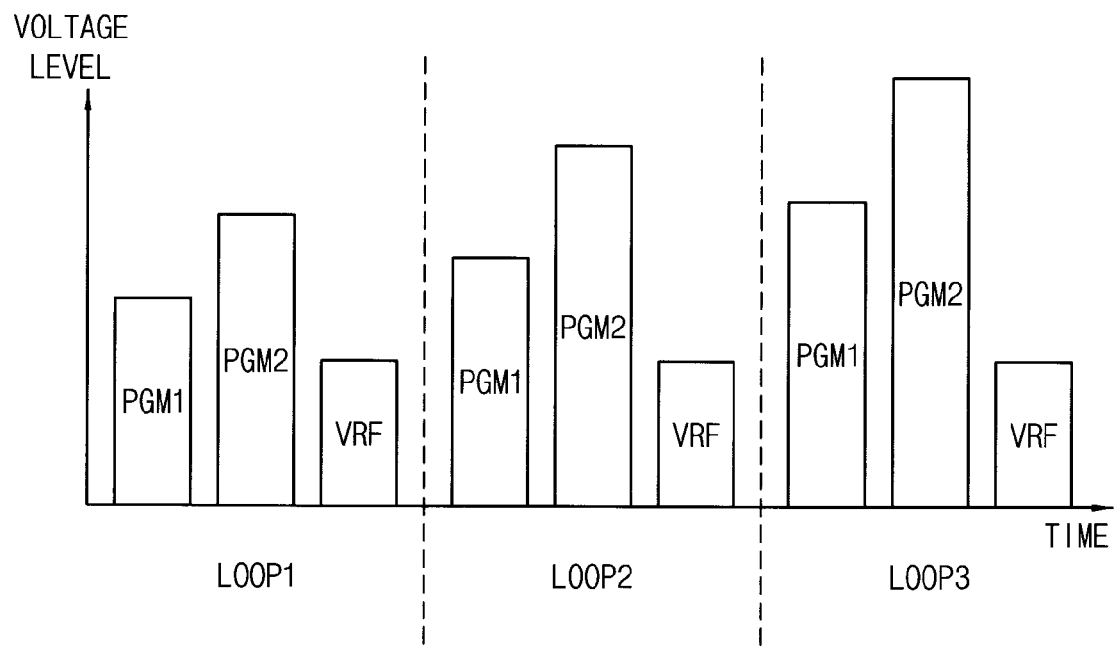
FIG. 6 is a diagram for describing an example of a second program operation or a third program operation of a program method according to example embodiments.

FIG. 6 is a diagram for describing an example of a second program operation or a third program operation of a program method according to example embodiments.

Referring to FIG. 6, a second program operation and/or a third program operation may be performed by applying different program voltages PGM1 and PGM2 to a fast cell group and a slow cell group by using cell group information generated during a first program operation.

For example, a first program voltage PGM1 may be applied to multi-level cells that belong to fast cell groups for respective intermediate program states, and a second program voltage PGM2 higher than the first program voltage PGM1 may be applied to multi-level cells that belong to slow cell groups for the respective intermediate program states. In some example embodiments, each of the first program voltage PGM1 and the second program voltage PGM2 may be an incremental step pulse. For example, unless all multi-level cells are determined to be programmed during a verify operation VRF, the first program voltage PGM1 and the second program voltage PGM2 may increase by predetermined step voltages, respectively, and the increased first program voltage PGM1 and the increased second program voltage PGM2 may be applied again to the multi-level cells.

As described above, different program voltages PGM1 and PGM2 may be applied to the fast cell group and the slow cell group during the second program operation and/or the third program operation of the method of programming the nonvolatile memory device according to example embodiments, which results in a relatively narrow threshold voltage distribution of each target program state.

Figure 7:
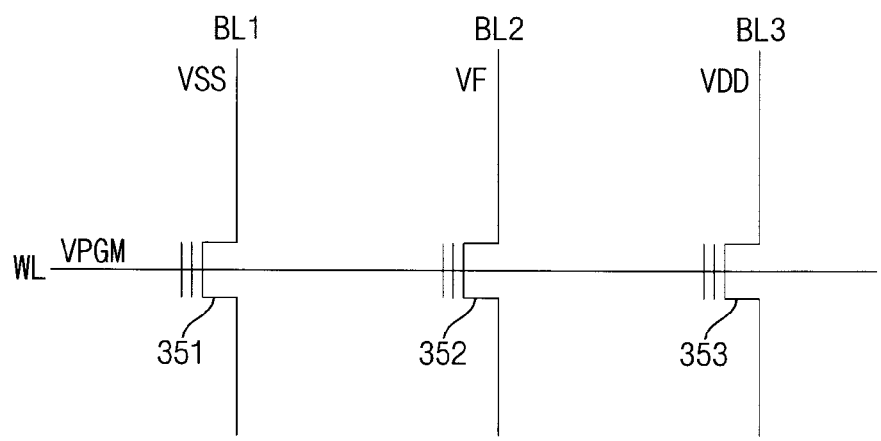
FIG. 7 is a diagram for describing another example of a second program operation or a third program operation of a program method according to example embodiments.

FIG. 7 is a diagram for describing another example of a second program operation or a third program operation of a program method according to example embodiments.

Referring to FIG. 7, a second program operation and/or a third program operation may be performed by applying different bitline voltages VSS and VF to a fast cell group and a slow cell group by using cell group information generated during a first program operation.

For example, a voltage of a low level (e.g., a ground voltage VSS) may be applied to bitlines BL1 coupled to multi-level cells 351 that belong to slow cell groups for respective intermediate program states, and a forcing voltage VF may be applied to bitlines BL2 coupled to multi-level cells 352 that belong to fast cell groups for the respective intermediate program states. Further, a voltage of a high level (e.g., a power supply voltage VDD) may be applied as a program inhibit voltage to bitlines BL3 coupled to multi-level cells 353 that are determined to be programmed during a verify operation or that are not to be programmed. The forcing voltage VF may have a voltage level higher than the voltage of the low level and lower than the voltage of the high level. A program voltage VPGM may be applied to a wordline coupled to the multi-level cells 351, 352 and 353. Channels of the multi-level cells 352 to which the forcing voltage VF is applied may be boosted, and thus an effective voltage level of the program voltage VPGM may decrease with respect to the multi-level cells 352. Accordingly, increments of threshold voltages of the multi-level cells 352 that belong to the fast cell group where the forcing voltage VF is applied may be less than increments of threshold voltages of the multi-level cells 351 that belong to the slow cell group where the voltage of the low level is applied.

As described above, different bitline voltages VSS and VF may be applied to the fast cell group and the slow cell group during the second program operation and/or the third program operation of the method of programming the nonvolatile memory device according to example embodiments, which results in a relatively narrow threshold voltage distribution of each target program state.

Figures 8, 9:
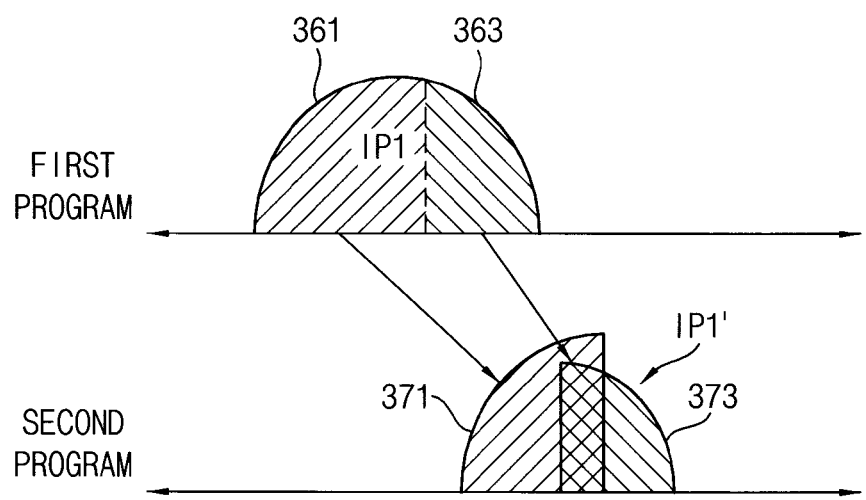
FIG. 8 is a diagram illustrating an example of an increase of a threshold voltage during a second program operation or a third program operation of a program method according to example embodiments.
FIG. 9 is a diagram illustrating an example of an order of program operations of a program method according to example embodiments.

FIG. 8 is a diagram illustrating an example of an increase of a threshold voltage during a second program operation or a third program operation of a program method according to example embodiments.

Referring to FIG. 8, during a second program operation, increments of threshold voltages of multi-level cells 363 that belong to the fast cell group may be less than increments of threshold voltages of the multi-level cells 361 that belong to the slow cell group. In some example embodiments, as illustrated in FIG. 6, a first program voltage PGM1 may be applied to the multi-level cells 363 that belong to the fast cell group, and a second program voltage PGM2 higher than the first program voltage PGM1 may be applied to the multi-level cells 361 that belong to the slow cell group, thereby narrowing the threshold voltage distribution of each program state during the second program operation. In other example embodiments, as illustrated in FIG. 7, a voltage of a low level (e.g., VSS) may be applied to the multi-level cells 361 that belong to the slow cell group, and a forcing voltage VF higher than the voltage of the low level may be applied to the multi-level cells 363 that belong to the fast cell group, thereby narrowing the threshold voltage distribution of each program state during the second program operation.

During a third program operation, different program voltages and/or different bitline voltages may be applied to the multi-level cells 371 that belong to the slow cell group and the multi-level cells 373 that belong to the fast cell group, thereby further narrowing the threshold voltage distribution of each target program state.

Figure 10:
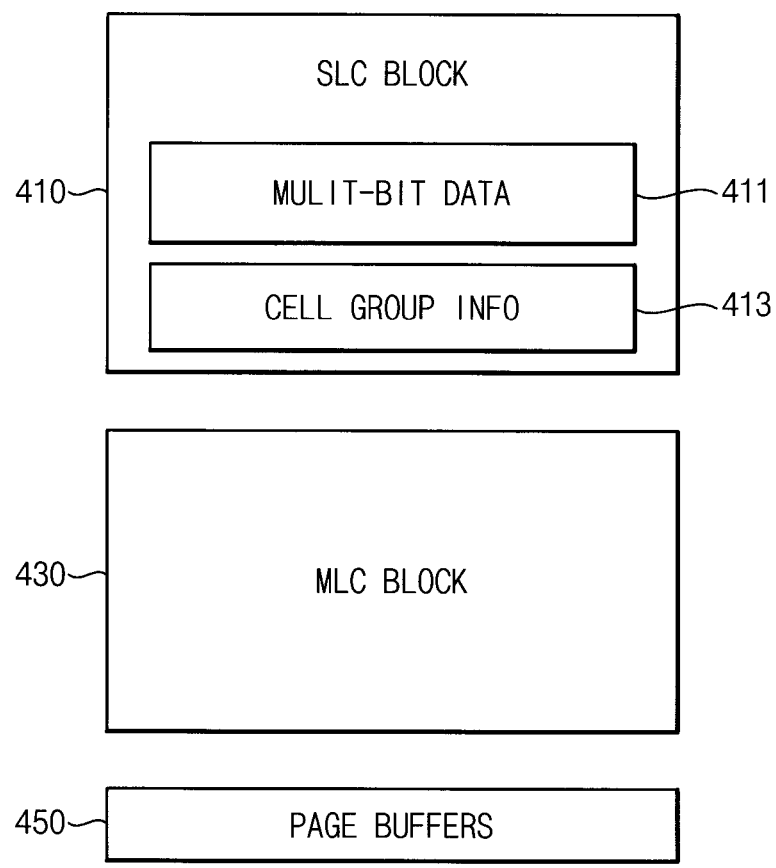
FIG. 10 is a block diagram illustrating an example of a memory cell array and a plurality of page buffers included in a nonvolatile memory device according to example embodiments.
Figure 11:
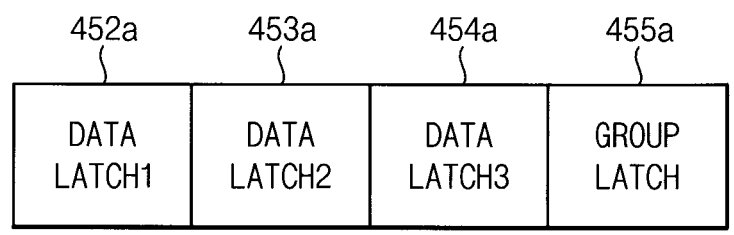
FIG. 11 is a block diagram illustrating an example of a page buffer included in a nonvolatile memory device according to example embodiments.
Figure 12:
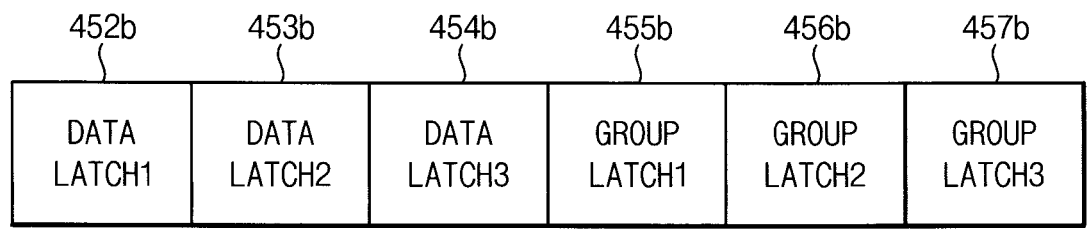
FIG. 12 is a block diagram illustrating another example of a page buffer included in a nonvolatile memory device according to example embodiments.

FIG. 9 is a diagram illustrating an example of an order of program operations of a program method according to example embodiments. FIG. 10 is a block diagram illustrating an example of a memory cell array and a plurality of page buffers included in a nonvolatile memory device according to example embodiments. FIG. 11 is a block diagram illustrating an example of a page buffer included in a nonvolatile memory device according to example embodiments. FIG. 12 is a block diagram illustrating another example of a page buffer included in a nonvolatile memory device according to example embodiments.

Referring to FIGS. 9 and 10, multi-bit data may be loaded into a plurality of page buffers 450 included in a nonvolatile memory device 400, and a first program operation for a first wordline WL1 of a multi-level cell block 430 may be performed based on the loaded multi-bit data. In some example embodiments, to perform the first program operation for the first wordline WL1, the multi-bit data may be loaded from a host (not shown) into the plurality of page buffers 450 via a memory controller (not shown). In other example embodiments, the multi-bit data may be loaded from the host into the plurality of page buffers 450 via the memory controller, and the multi-bit data loaded into the plurality of page buffers 450 may be programmed to a plurality of pages 411 included in at least one single level cell block 410. Thereafter, to perform the first program operation for the first wordline WL1, the multi-bit data may be loaded again from the plurality of pages 411 into the plurality of page buffers 450. During the first program operation, cell group information for multi-level cells coupled to the first wordline WL1 may be generated.

In some example embodiments, as illustrated in FIG. 11, each page buffer 451a of the plurality of page buffers 450 may include first through third data latches 452a, 453a and 454a and one cell group information latch 455a. For example, the multi-bit data for the multi-level cells coupled to the first wordline WL1 may be stored in the first through third data latches 452a, 453a and 454a. During the first program operation for the first wordline WL1, the cell group information for the multi-level cells coupled to the first wordline WL1 may be written to the cell group information latch 455a.

In other example embodiments, as illustrated in FIG. 12, each page buffer 451b of the plurality of page buffers 450 may include first through third data latches 452b, 453b and 454b and first through third cell group information latches 455b, 456b and 457b. For example, the multi-bit data for the multi-level cells coupled to the first wordline WL1 may be stored in the first through third data latches 452b, 453b and 454b. During the first program operation for the first wordline WL1, the cell group information for the multi-level cells coupled to the first wordline WL1 may be written to one of the first through third cell group information latches 455b, 456b and 457b.

After a first program operation for a second wordline WL2 is performed, a second program operation for the first wordline WL1 may be performed. To perform the second program operation for the first wordline WL1, the multi-bit data may be loaded again from the memory controller or from the plurality of pages 411 into the plurality of page buffers 450. The second program operation for the first wordline WL1 may be performed based on the cell group information for the multi-level cells coupled to the first wordline WL1. Thus, to perform the second program operation for the first wordline WL1, the cell group information for the multi-level cells coupled to the first wordline WL1 may be loaded or retained in the plurality of page buffers 450.

In some example embodiments, after the first program operation for the first wordline WL1, the cell group information for the multi-level cells coupled to the first wordline WL1 stored in the cell group information latch 455a may be programmed to a cell group information page 413 included in the at least one single level cell block 410. Thereafter, when the second program operation for the first wordline WL1 is performed, the cell group information for the multi-level cells coupled to the first wordline WL1 may be loaded from the cell group information page 413 into the plurality of page buffers 450.

In other example embodiments, each cell group information generated during the first program operation for the first wordline WL1 may be stored in one of the first through third cell group information latches 455b, 456b and 457b, and each cell group information generated during the first program operation for the second wordline WL2 may be stored in another one of the first through third cell group information latches 455b, 456b and 457b. Thus, the cell group information for the multi-level cells coupled to the first wordline WL1 may not be programmed to a memory block (e.g., a single level cell block 410), and may be retained in the plurality of page buffers 450.

After a first program operation for a third wordline WL3 is performed and a second program operation for the second wordline WL2 is performed, a third program operation for the first wordline WL1 may be performed. To perform the third program operation for the first wordline WL1, the multi-bit data may be loaded again from the memory controller or from the plurality of pages 411 into the plurality of page buffers 450. The third program operation for the first wordline WL1 may be performed based on the cell group information for the multi-level cells coupled to the first wordline WL1. In some example embodiments, to perform the third program operation for the first wordline WL1, the cell group information for the multi-level cells coupled to the first wordline WL1 may be loaded again from the cell group information page 413 into the plurality of page buffers 450. In other example embodiments, each page buffer 451b may include at least three cell group information latches 455b, 456b and 457b, and thus the cell group information for the multi-level cells coupled to the first wordline WL1 may be retained in the plurality of page buffers 450.

In the method of programming the nonvolatile memory device 400 according to example embodiments, the first through third program operations for respective wordlines WL1, WL2 and WL3 may be performed in an order described above, thereby reducing wordline coupling. In the method of programming the nonvolatile memory device 400 according to example embodiments, the cell group information generated during the first program operation for the respective wordlines WL1, WL2 and WL3 may be stored in the single level cell block 410 or in the plurality of cell group information latches 455b, 456b and 457b included in each page buffer 451b, and the second program operations and/or the third program operations may be performed based on the stored cell group information. Accordingly, each target program state may have a relatively narrow threshold voltage distribution width.

Figure 13:
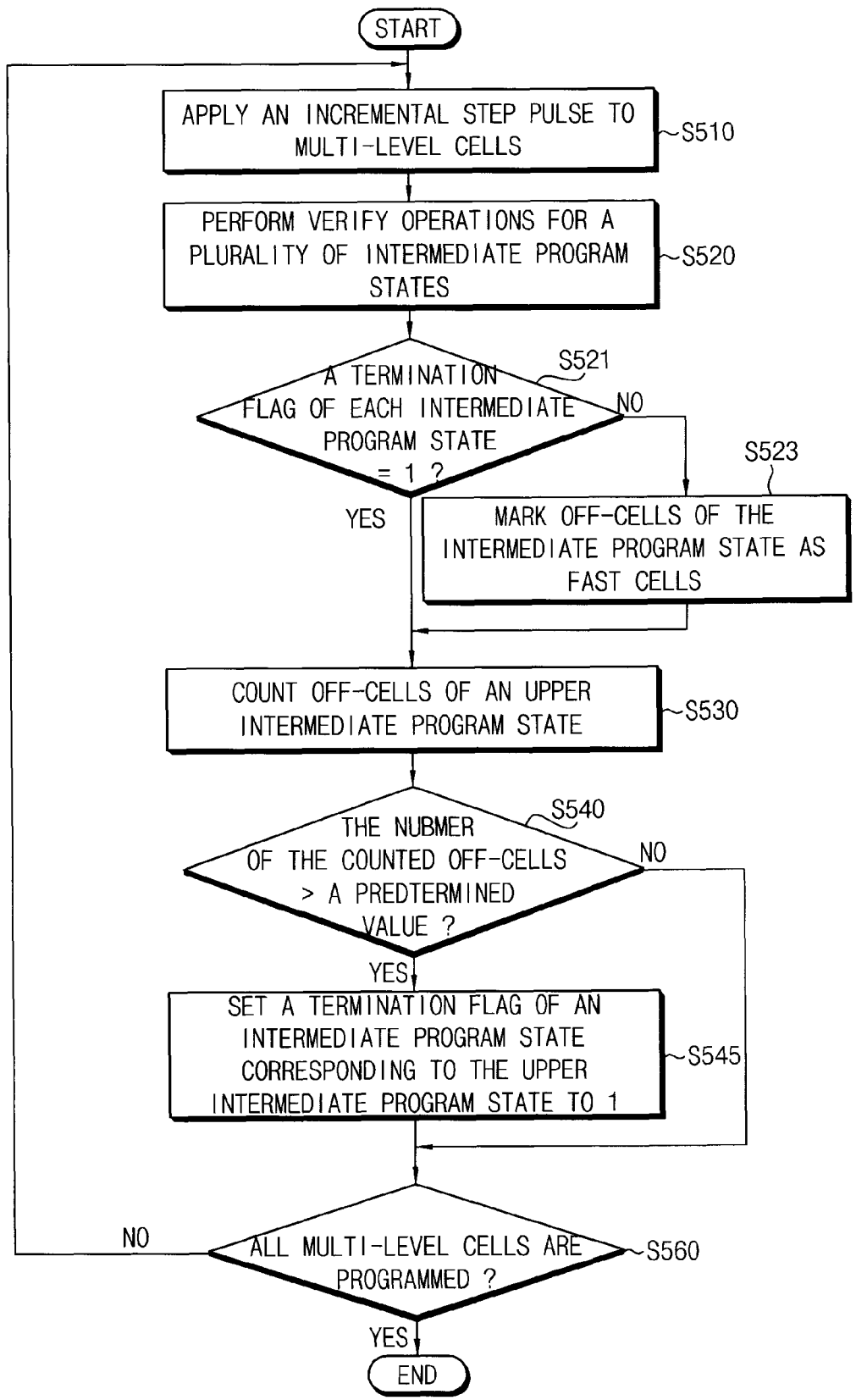
FIG. 13 is a flow chart illustrating a first program operation of a program method according to example embodiments.
Figure 14A:
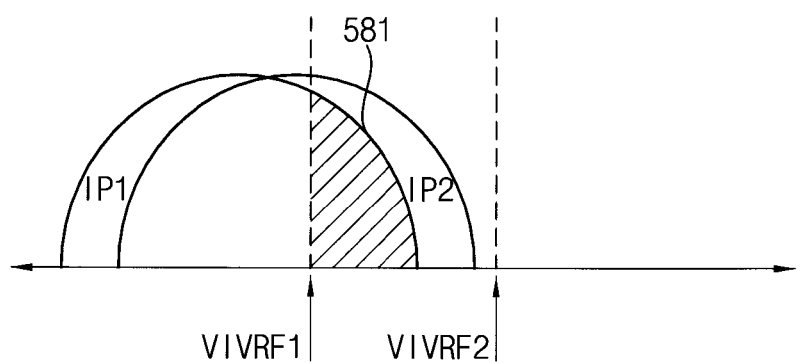
FIGS. 14A and 14B are diagrams illustrating an example of generating cell group information for a first intermediate program state during a first program operation illustrated in FIG. 13.
Figure 14B:
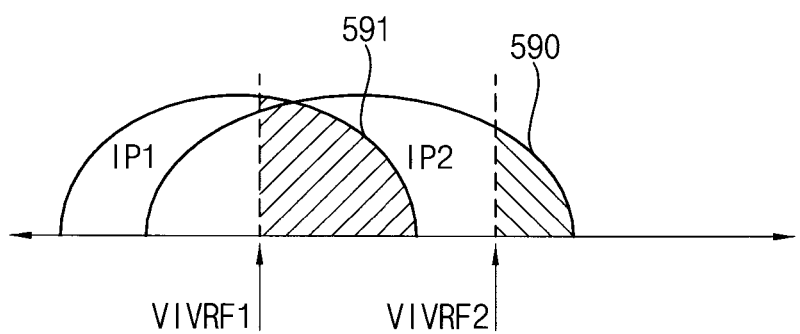

FIG. 13 is a flow chart illustrating a first program operation of a program method according to example embodiments. FIGS. 14A and 14B are diagrams illustrating an example of generating cell group information for a first intermediate program state during a first program operation illustrated in FIG. 13.

Referring to FIGS. 2 and 13, an incremental step pulse may be applied to multi-level cells included in a multi-level cell block (S510). After the incremental step pulse is applied, verify operations for first through seventh intermediate program states IP1, IP2, IP3, IP4, IP5, IP6 and IP7 may be sequentially performed (S520).

During (or substantially directly after) the verify operation for each intermediate program state, off-cells of the each intermediate program state may be marked as fast cells according to a termination flag of the each intermediate program state (S521 and S523). Accordingly, cell group information for the each intermediate program state may be generated.

While (or substantially directly after) the verify operation for an upper intermediate program state (e.g., IP2) corresponding to the each intermediate program state (e.g., IP1) is performed (S520), off-cells of the upper intermediate program state may be counted (S530), and the number of the counted off-cells of the upper intermediate program state (or a ratio of the counted off-cells to multi-level cells of the upper intermediate program state) may be compared with a predetermined value (S540).

If the number of the counted off-cells of the upper intermediate program state is less than or equal to the predetermined value (S540: NO), a subsequent verify operation for an intermediate program state higher than the upper intermediate program state may be performed (S520). After the verify operations for all of the intermediate program states IP1, IP2, IP3, IP4, IP5, IP6 and IP7 are performed, a subsequent program loop may be performed unless all multi-level cells are determined to be programmed during the verify operations (S560: NO). Thus, the incremental step pulse may increase by a predetermined step pulse, and may be applied again to the multi-level cells (S510).

If the number of the counted off-cells of the upper intermediate program state (e.g., IP2) is greater than the predetermined value (S540: YES), the termination flag of the intermediate program state (e.g., IP1) corresponding to the upper intermediate program state (e.g., IP2) may be set to '1' (S545). Accordingly, the multi-level cells of the intermediate program state (e.g., IP1) that become the off-cells during subsequent program loops may not be marked as the fast cells (S521: YES). That is, the cell group information for each intermediate program state may be generated by marking the off-cells of the intermediate program state as the fast cells until the number of the counted off-cells of the corresponding upper intermediate program state becomes greater than the predetermined value.

For example, as illustrated in FIG. 14A, if the number of counted off-cells of a second intermediate program state IP2 is less than or equal to the predetermined value, or if a termination flag of a first intermediate program state IP1 is '0', off-cells 531 of the first intermediate program state IP1 may be marked as fast cells. Thereafter, as illustrated in FIG. 14B, off-cells 591 of the first intermediate program state IP1 may be marked as the fast cells, and the termination flag of the first intermediate program state IP1 may be set to '1' at a program loop when the number of counted off-cells 590 of the second intermediate program state IP2 becomes greater than the predetermined number. During subsequent program loops, since the termination flag of the first intermediate program state IP1 is '1', new off-cells of the first intermediate program state IP1 may not be marked as fast cells.

Similarly, until the numbers of counted off-cells of third through seventh intermediate program states IP3, IP4, IP5, IP6 and IP7 become greater than the predetermined value (S540: YES), off-cells of the second through sixth intermediate program states IP2, IP3, IP4, IP5 and IP6 may be marked as the fast cells, and thus cell group information for the second through sixth intermediate program states IP2, IP3, IP4, IP5 and IP6 may be generated (S521: NO and S523). Cell group information for the seventh intermediate program state IP7 may be generated by comparing the number of its off-cells with another predetermined value. As described above, the cell group information for the first through seventh intermediate program states IP1, IP2, IP3, IP4, IP5, IP6 and IP7 may be generated using the first through seventh intermediate verify voltages VIVRF1, VIVRF2, VIVRF3, VIVRF4, VIVRF5, VIVRF6 and VIVRF7 without application of an additional verify voltage or an additional voltage for classifying groups. Accordingly, the generation of the cell group information may not substantially increase a program time. Further, since the multi-level cells are classified as the fast cell group or the slow cell group by using the intermediate verify voltages VIVRF1, VIVRF2, VIVRF3, VIVRF4, VIVRF5, VIVRF6 and VIVRF7 close to target verify voltages VVRF1, VVRF2, VVRF3, VVRF4, VVRF5, VVRF6 and VVRF7, the cell group information may be accurate.

Although FIGS. 14A and 14B illustrate an example where the cell group information for each intermediate program state (e.g., IP1) is generated by checking whether a result of verification for an upper intermediate program state (e.g., IP2) that is one state higher than the intermediate program state (e.g., IP1) satisfies a predetermined criterion, according to example embodiments, the cell group information for each intermediate program state may be generated by checking whether a result of verification for any upper intermediate program state that is determined according to a width of each threshold voltage distribution, an interval between intermediate verify voltages, etc. satisfies the predetermined criterion.

If all multi-level cells are determined to be programmed during the verify operations (S560: YES), a first program operation may be completed. As described above, during the first program operation of the program method according to example embodiments, the multi-level cells of each intermediate program state may be divided into the fast cell group and the slow cell group by marking off-cells of the each intermediate program state as fast cells until the number of off-cells of an upper intermediate program state corresponding to the each intermediate program state becomes greater than the predetermined number, thereby accurately and rapidly generating the cell group information.

A second program operation and/or a third program operation of the program method according to example embodiments may be performed based on the cell group information generated during the first program operation. For example, the second program operation and/or the third program operation may be performed by applying different program voltages or different bitline voltages to the fast cell group and the slow cell group. Accordingly, each target program state may have a relatively narrow threshold voltage distribution width.

Figure 15:
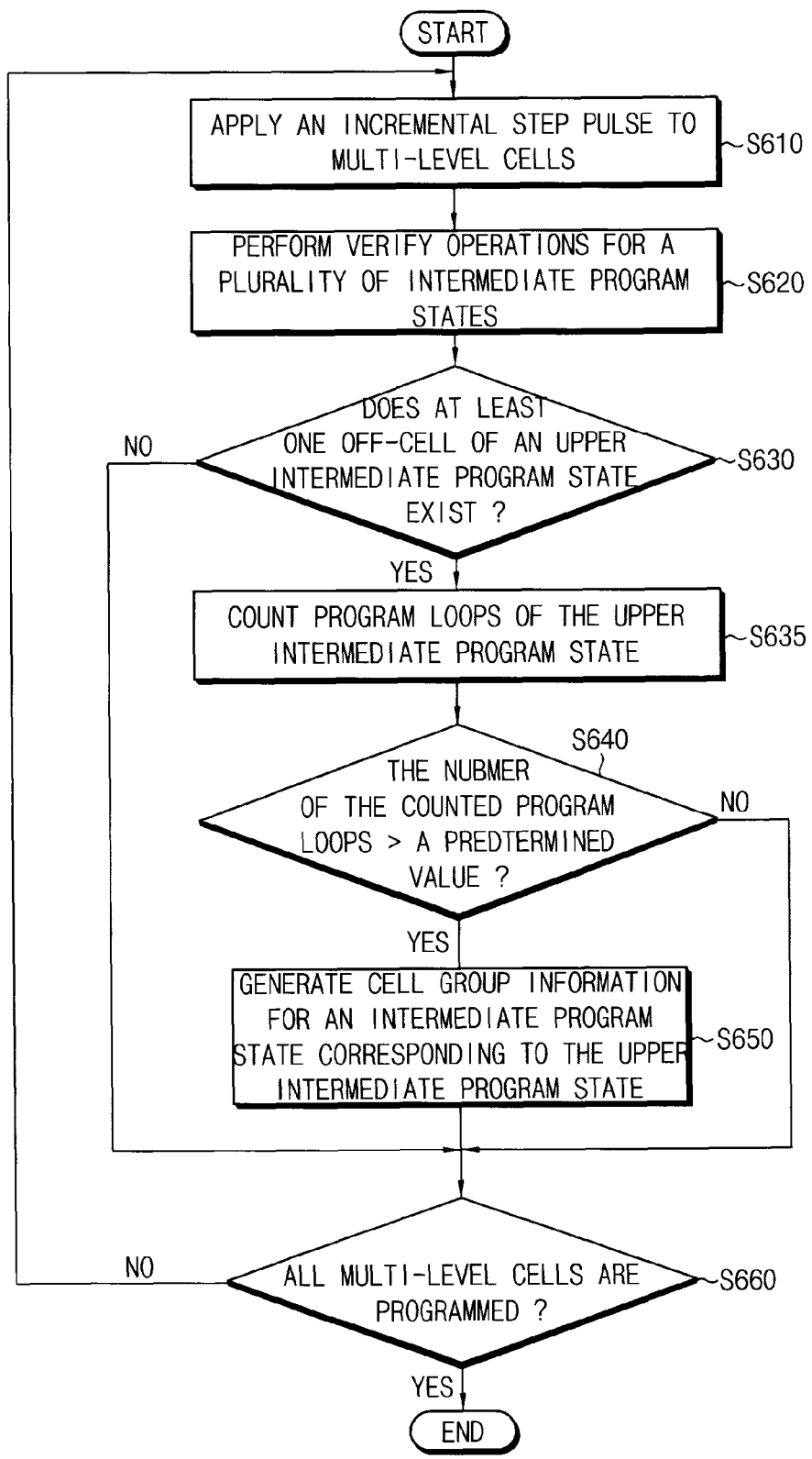
FIG. 15 is a flow chart illustrating a first program operation of a program method according to example embodiments.
Figure 16:
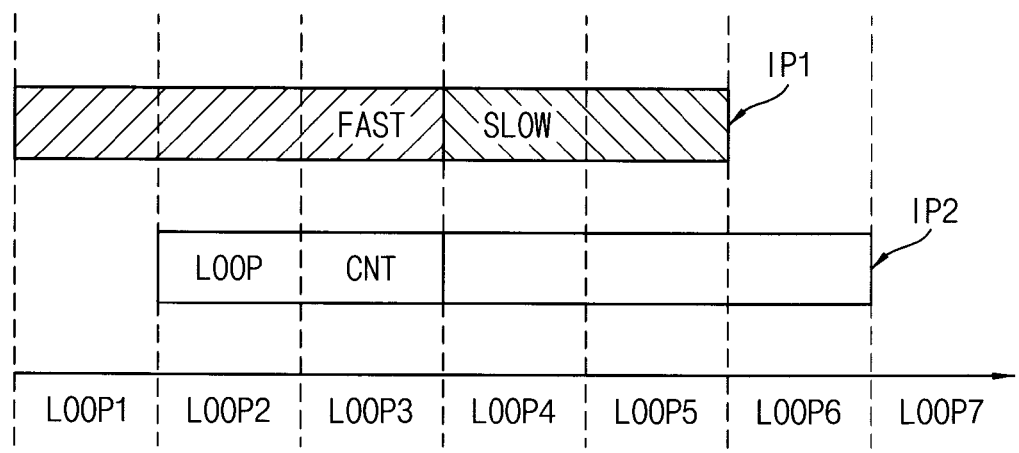
FIG. 16 is a diagram illustrating an example of generating cell group information for a first intermediate program state during a first program operation illustrated in FIG. 15.

FIG. 15 is a flow chart illustrating a first program operation of a program method according to example embodiments. FIG. 16 is a diagram illustrating an example of generating cell group information for a first intermediate program state during a first program operation illustrated in FIG. 15.

Referring to FIGS. 2 and 15, an incremental step pulse may be applied to multi-level cells included in a multi-level cell block (S610). After the incremental step pulse is applied, verify operations for first through seventh intermediate program states IP1, IP2, IP3, IP4, IP5, IP6 and IP7 may be sequentially performed (S620).

During (or substantially directly after) the verify operation for an upper intermediate program state (e.g., IP2) corresponding to each intermediate program state (e.g., IP1), program loops for the upper intermediate program state (e.g., IP2) may be counted according to existence of an off-cell of the upper intermediate program state (e.g., IP2) (S630 and S635) to generate cell group information for the each intermediate program state (e.g., IP1) (S650).

If no off-cell of the upper intermediate program state exists (S630: NO), the program loop for the upper intermediate program state (e.g., IP2) may not be counted, and a subsequent verify operation for an intermediate program state (e.g., IP3) higher than the upper intermediate program state may be performed (S620). After the verify operations for all of the intermediate program states IP1, IP2, IP3, IP4, IP5, IP6 and IP7 are performed, a subsequent program loop may be performed unless all multi-level cells are determined to be programmed during the verify operations (S660: NO). Thus, the incremental step pulse may increase by a predetermined step pulse, and may be applied again to the multi-level cells (S610).

If at least one off-cell of the upper intermediate program state (e.g., IP2) exists (S630: YES), the program loops for the upper intermediate program state (e.g., IP2) may be counted (S635). At a program loop when the number of the counted program loops for the upper intermediate program state (e.g., IP2) becomes greater than a predetermined value (or at the next program loop) (S640: YES), cell group information for the intermediate program state (e.g., IP1) corresponding to the upper intermediate program state (e.g., IP2) may be generated (S650).

FIG. 16 illustrates an example where an off-cell of a second intermediate program state IP2 may exist from a second program loop LOOP2 and the predetermined value is 1. The program loops for the second intermediate program state IP2 may be counted from the second program loop LOOP2, and the number of the counted program loops may be 1 at the second program loop LOOP2 (S635). If the number of the counted program loops is less than or equal to the predetermined number (S640: NO), the next program loop, or a third program loop LOOP3 may be performed. At the third program loop LOOP3, the number of the counted program loops for the second intermediate program state IP2 may increase to 2, and may become greater than the predetermined number (S635). If the number of the counted program loops for the second intermediate program state IP2 is greater than the predetermined number (S640: YES), the cell group information for the first intermediate program state IP1 may be generated (S650). For example, at the third program loop LOOP3, off-cells of the first intermediate program state IP1 may be marked as fast cells, and on-cells of the first intermediate program state IP1 may be marked as slow cells. Accordingly, cell group information for the first intermediate program state IP1 may be generated at the third program loop LOOP3.

Similarly, if the numbers of counted program loops of third through seventh intermediate program states IP3, IP4, IP5, IP6 and IP7 become greater than the predetermined value (S640: YES), cell group information for the second through sixth intermediate program states IP2, IP3, IP4, IP5 and IP6 may be generated (S560). Cell group information for the seventh intermediate program state IP7 may be generated by comparing the number of its program loops with another predetermined value. As described above, the cell group information for the first through seventh intermediate program states IP1, IP2, IP3, IP4, IP5, IP6 and IP7 may be generated using the first through seventh intermediate verify voltages VIVRF1, VIVRF2, VIVRF3, VIVRF4, VIVRF5, VIVRF6 and VIVRF7 without application of an additional verify voltage or an additional voltage for classifying groups. Accordingly, the generation of the cell group information may not substantially increase a program time. Further, since the multi-level cells are classified as the fast cell group or the slow cell group by using the intermediate verify voltages VIVRF1, VIVRF2, VIVRF3, VIVRF4, VIVRF5, VIVRF6 and VIVRF7 close to target verify voltages VVRF1, VVRF2, VVRF3, VVRF4, VVRF5, VVRF6 and VVRF7, the cell group information may be accurate.

Although FIG. 16 illustrates an example where the cell group information for each intermediate program state (e.g., IP1) is generated by checking whether a result of verification for an upper intermediate program state (e.g., IP2) that is one state higher than the intermediate program state (e.g., IP1) satisfies a predetermined criterion, according to example embodiments, the cell group information for each intermediate program state may be generated by checking whether a result of verification for any upper intermediate program state that is determined according to a width of each threshold voltage distribution, an interval between intermediate verify voltages, etc. satisfies the predetermined criterion.

If all multi-level cells are determined to be programmed during the verify operations (S660: YES), a first program operation may be completed. As described above, during the first program operation of the program method according to example embodiments, the multi-level cells of each intermediate program state may be divided into the fast cell group and the slow cell group when the number of program loops for an upper intermediate program state corresponding to the each intermediate program state becomes greater than the predetermined number, thereby accurately and rapidly generating the cell group information.

A second program operation and/or a third program operation of the program method according to example embodiments may be performed based on the cell group information generated during the first program operation. For example, the second program operation and/or the third program operation may be performed by applying different program voltages or different bitline voltages to the fast cell group and the slow cell group. Accordingly, each target program state may have a relatively narrow threshold voltage distribution width.

Figure 17A:
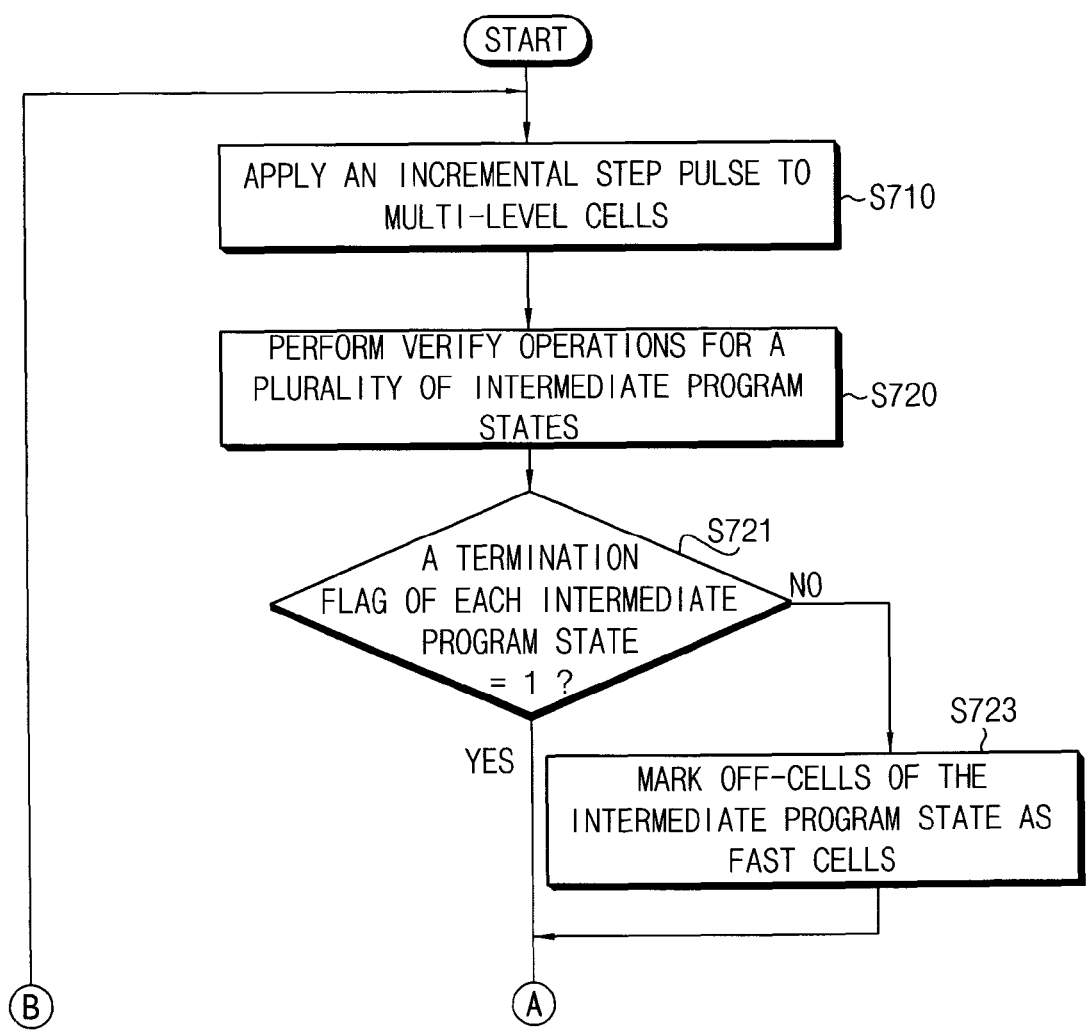
FIGS. 17A and 17B are flow charts illustrating a first program operation of a program method according to example embodiments.
Figure 17B:
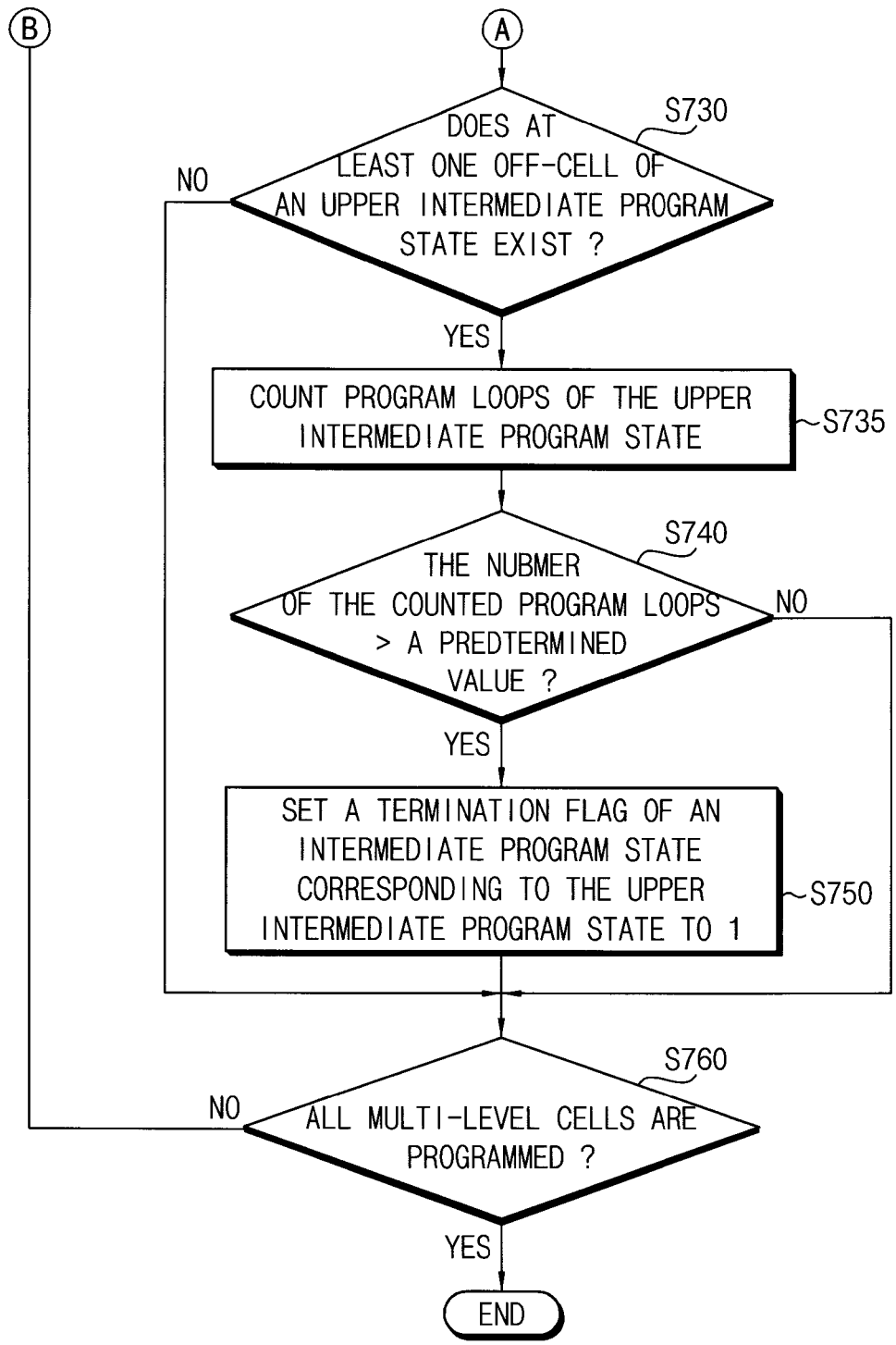

FIGS. 17A and 17B are flow charts illustrating a first program operation of a program method according to example embodiments.

Referring to FIGS. 2, 17A and 17B, an incremental step pulse may be applied to multi-level cells included in a multi-level cell block (S710). After the incremental step pulse is applied, verify operations for first through seventh intermediate program states IP1, IP2, IP3, IP4, IP5, IP6 and IP7 may be sequentially performed (S720).

During (or substantially directly after) the verify operation for each intermediate program state, off-cells of the intermediate program state may be marked as fast cells according to a termination flag of the intermediate program state (S721 and S723). Accordingly, cell group information for the intermediate program state may be generated.

During (or substantially directly after) the verify operation for an upper intermediate program state (e.g., IP2) corresponding to each intermediate program state (e.g., IP1), program loops for the upper intermediate program state (e.g., IP2) may be counted according to existence of an off-cell of the upper intermediate program state (e.g., IP2) (S730 and S735).

If no off-cell of the upper intermediate program state exists (S730: NO) or if the number of the counted program loops for the upper intermediate program state is less than or equal to a predetermined value (S740: NO), a subsequent verify operation for an intermediate program state higher than the upper intermediate program state may be performed (S720). After the verify operations for all of the intermediate program states IP1, IP2, IP3, IP4, IP5, IP6 and IP7 are performed, a subsequent program loop may be performed unless all multi-level cells are determined to be programmed during the verify operations (S760: NO). Thus, the incremental step pulse may increase by a predetermined step pulse, and may be applied again to the multi-level cells (S710).

If the number of the counted program loops for the upper intermediate program state (e.g., IP2) is greater than the predetermined value (S740: YES), a termination flag of the intermediate program state (e.g., IP1) corresponding to the upper intermediate program state (e.g., IP2) may be set to '1' (S745). Accordingly, multi-level cells of the intermediate program state (e.g., IP1) that become off-cells during subsequent program loops may not be marked as the fast cells (S721: YES). Thus, the off-cells of the intermediate program state (e.g., IP1) may be marked as the fast cells until the number of the counted program loops for the upper intermediate program state (e.g., IP2) becomes greater than the predetermined number, and the cell group information for the intermediate program state (e.g., IP1) may be generated.

As described above, the cell group information for the first through seventh intermediate program states IP1, IP2, IP3, IP4, IP5, IP6 and IP7 may be generated using the first through seventh intermediate verify voltages VIVRF1, VIVRF2, VIVRF3, VIVRF4, VIVRF5, VIVRF6 and VIVRF7 without application of an additional verify voltage or an additional voltage for classifying groups. Accordingly, the generation of the cell group information may not substantially increase a program time. Further, since the multi-level cells are classified as the fast cell group or the slow cell group by using the intermediate verify voltages VIVRF1, VIVRF2, VIVRF3, VIVRF4, VIVRF5, VIVRF6 and VIVRF7 close to target verify voltages VVRF1, VVRF2, VVRF3, VVRF4, VVRF5, VVRF6 and VVRF7, the cell group information may be accurate.

If all multi-level cells are determined to be programmed during the verify operations (S760: YES), a first program operation may be completed. As described above, during the first program operation of the program method according to example embodiments, the multi-level cells of each intermediate program state may be divided into the fast cell group and the slow cell group by marking off-cells of each intermediate program state as fast cells until the number of program loops for an upper intermediate program state corresponding to the each intermediate program state becomes greater than the predetermined number, thereby accurately and rapidly generating the cell group information.

A second program operation and/or a third program operation of the program method according to example embodiments may be performed based on the cell group information generated during the first program operation. For example, the second program operation and/or the third program operation may be performed by applying different program voltages or different bitline voltages to the fast cell group and the slow cell group. Accordingly, each target program state may have a relatively narrow threshold voltage distribution width.

Figure 18:
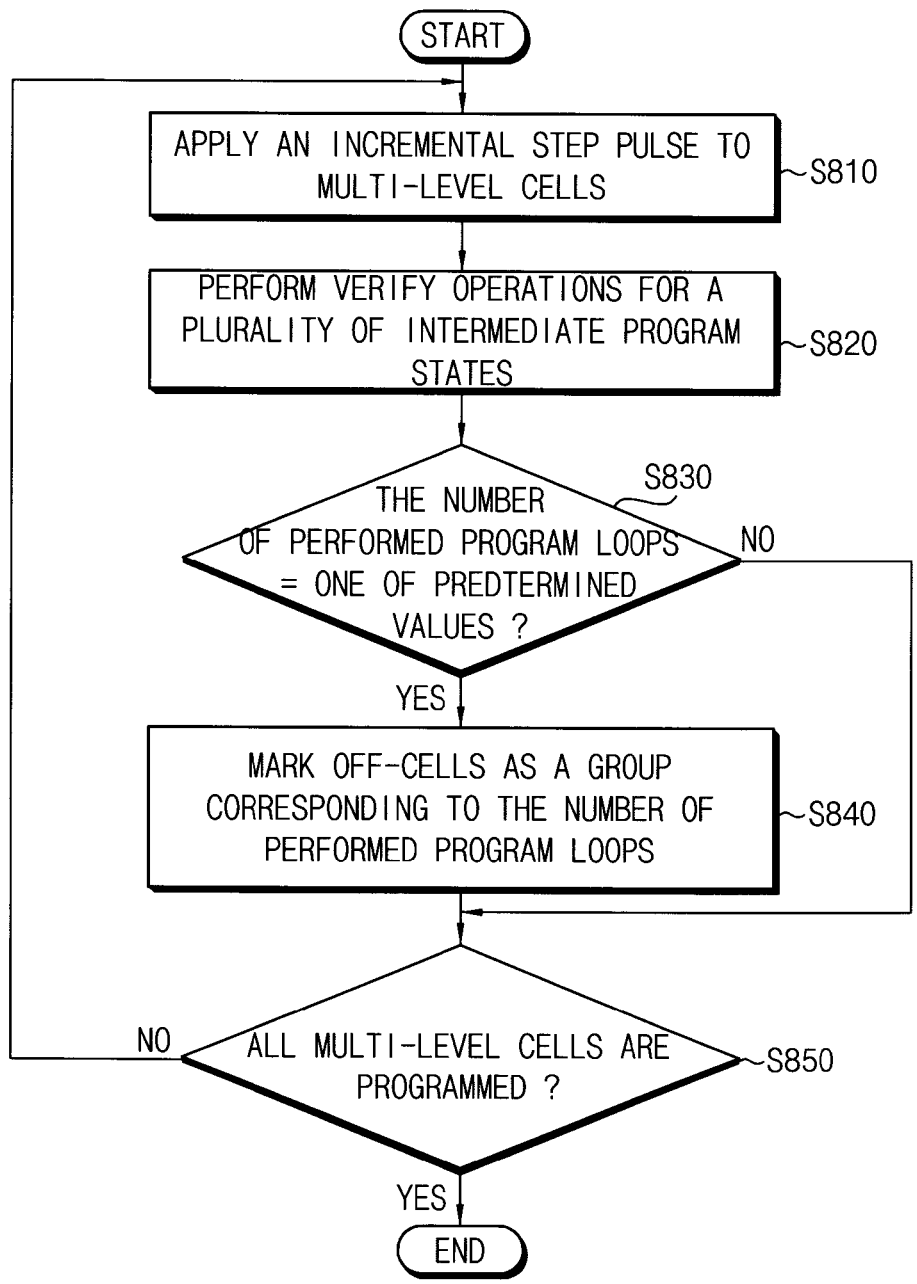
FIG. 18 is a flow chart illustrating a first program operation of a program method according to example embodiments.
Figure 19:
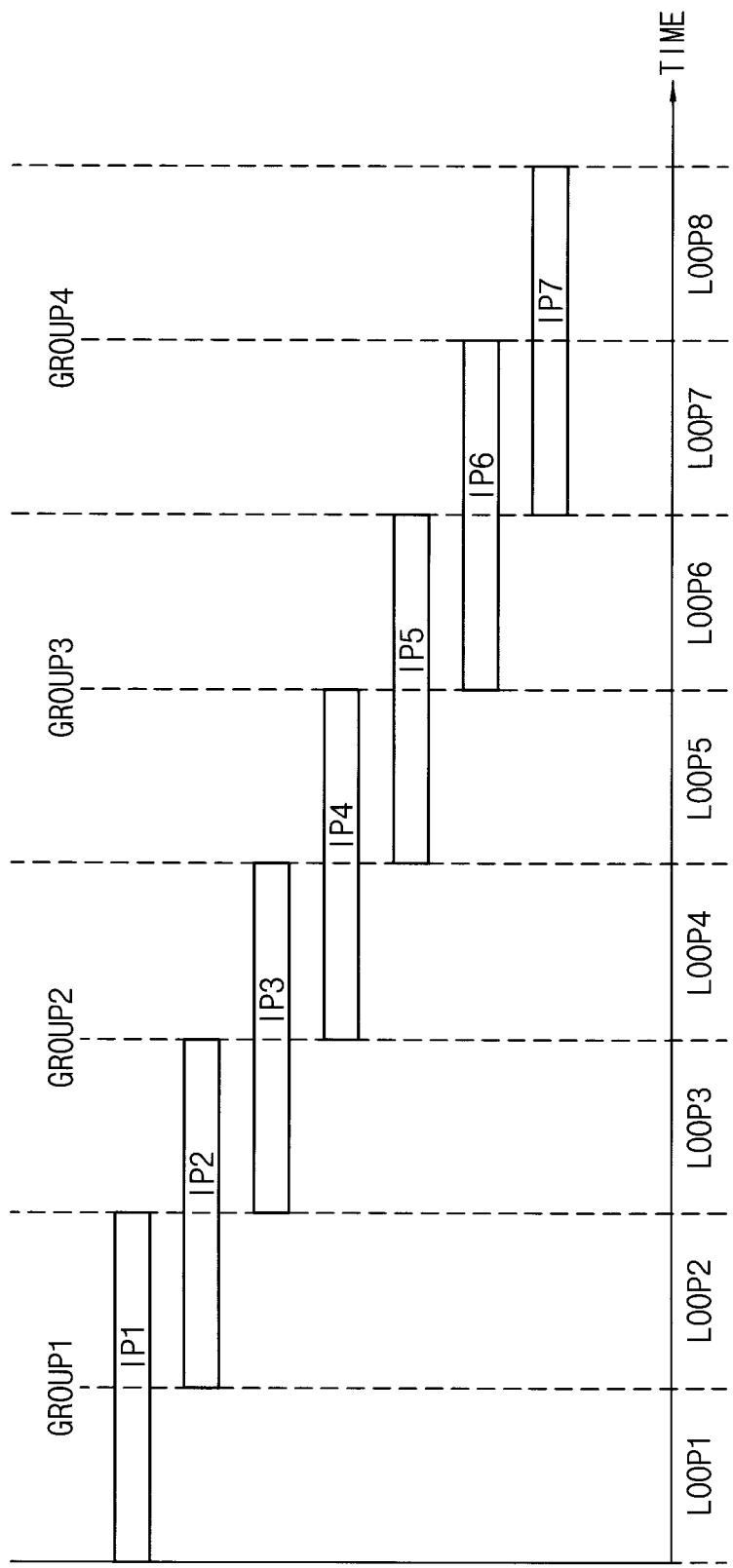
FIG. 19 is a diagram illustrating an example of generating cell group information for a first intermediate program state during a first program operation illustrated in FIG. 18.

FIG. 18 is a flow chart illustrating a first program operation of a program method according to example embodiments. FIG. 19 is a diagram illustrating an example of generating cell group information for a first intermediate program state during a first program operation illustrated in FIG. 18.

Referring to FIGS. 2 and 18, each program loop of a first program operation may include a program step and a verify step. At the program step, a program voltage may be applied to multi-level cells included in a multi-level cell block (S810). The program voltage may be an incremental step pulse that increases by a predetermined step voltage per program loop. At the verify step, verify operations for first through seventh intermediate program states IP1, IP2, IP3, IP4, IP5, IP6 and IP7 may be sequentially performed (S820).

If each program loop is performed, the number of performed program loops may be compared with predetermined values (S830). If the number of the performed program loops is not the same as any of the predetermined values (S830: NO), a subsequent program loop may be performed (S850: NO, S810 and S820). If the number of the performed program loops is the same as one of the predetermined values (S830: YES), off-cells may be marked as one of a plurality of groups corresponding to the number of the performed program loops (S840).

FIG. 19 illustrates an example where the first program operation includes first through eighth program loops LOOP1, LOOP2, LOOP3, LOOP4, LOOP5, LOOP6, LOOP7 and LOOP8, and the predetermined values are 2, 4, 6, and 8. In the example illustrated in FIG. 19, if the second program loop LOOP2 is performed, multi-level cells that become off-cells during the first and second program loops LOOP1 and LOOP2 may be marked as a first group GROUP1. For example, as illustrated in FIG. 19, multi-level cells of the first intermediate program state SP1 and a portion of multi-level cells of the second intermediate program state SP2 may be marked as the first group GROUP1. If the fourth program loop LOOP4 is performed, multi-level cells that become off-cells during the third and fourth program loops LOOP3 and LOOP4 may be marked as a second group GROUP2. For example, as illustrated in FIG. 19, another portion of the multi-level cells of the second intermediate program state SP2, multi-level cells of the third intermediate program state SP3 and a portion of multi-level cells of the fourth intermediate program state SP4 may be marked as the second group GROUP2. If the sixth program loop LOOP6 is performed, multi-level cells that become off-cells during the fifth and sixth program loops LOOP5 and LOOP6 may be marked as a third group GROUP3. For example, as illustrated in FIG. 19, another portion of the multi-level cells of the fourth intermediate program state SP4, multi-level cells of the fifth intermediate program state SP5 and a portion of multi-level cells of the sixth intermediate program state SP6 may be marked as the third group GROUP3. If the eighth program loop LOOP8 is performed, multi-level cells that become off-cells during the seventh and eighth program loops LOOP7 and LOOP8 may be marked as a fourth group GROUP4. For example, as illustrated in FIG. 19, another portion of the multi-level cells of the sixth intermediate program state SP6 and multi-level cells of the seventh intermediate program state SP7 may be marked as the fourth group GROUP4. As described above, each multi-level cell may be classified as one of the first through fourth groups GROUP1, GROUP2, GROUP3 and GROUP4 according to the number of program loops performed until the multi-level cell becomes an off-cell, and thus the cell group information representing to which one of the first through fourth groups GROUP1, GROUP2, GROUP3 and GROUP4 each multi-level cell belongs may be generated.

Referring again to FIG. 18, if all multi-level cells are determined to be programmed during the verify operations (S850: YES), a first program operation may be completed. As described above, during the first program operation of the program method according to example embodiments, respective multi-level cells may be divided into a plurality of groups according to the number of program loops performed until the respective multi-level cells are determined to be programmed, and thus the cell group information represents to which one of the plurality of groups each multi-level cell belongs.

Figure 20:
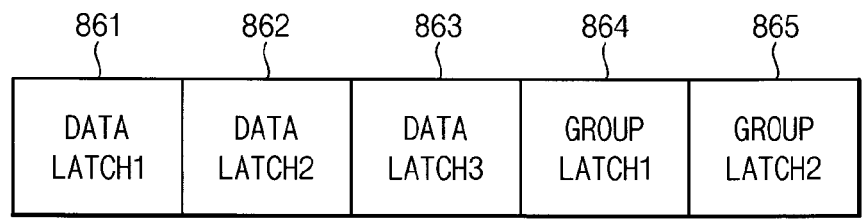
FIG. 20 is a block diagram illustrating an example of a page buffer included in a nonvolatile memory device according to example embodiments.

FIG. 20 is a block diagram illustrating an example of a page buffer included in a nonvolatile memory device according to example embodiments.

Referring to FIG. 20, each page buffer 860 may include first through third data latches 861, 862 and 863 and first and second cell group information latches 864 and 865.

Multi-bit data may be stored in the first through third data latches 861, 862 and 863 from a memory controller or from a single level cell block. Cell group information representing each multi-level cell belongs to which one of a plurality of groups may be stored in the first and second cell group information latches 864 and 865.

Referring also to the example illustrated in FIG. 19, "00" may be stored in the first and second cell group information latches 864 and 865 for multi-level cells that belong to a first group GROUP1, "01" may be stored in the first and second cell group information latches 864 and 865 for multi-level cells that belong to a second group GROUP2, "10" may be stored in the first and second cell group information latches 864 and 865 for multi-level cells that belong to a third group GROUP3, and "11" may be stored in the first and second cell group information latches 864 and 865 for multi-level cells that belong to a fourth group GROUP4.

In some example embodiments, after a first program operation, the cell group information stored in the first and second cell group information latches 864 and 865 may be programmed to at least one single level cell block. Thereafter, when a second program operation and/or a third program operation are performed, the cell group information may be loaded from the at least one single level cell block into the first and second cell group information latches 864 and 865.

Figure 21:
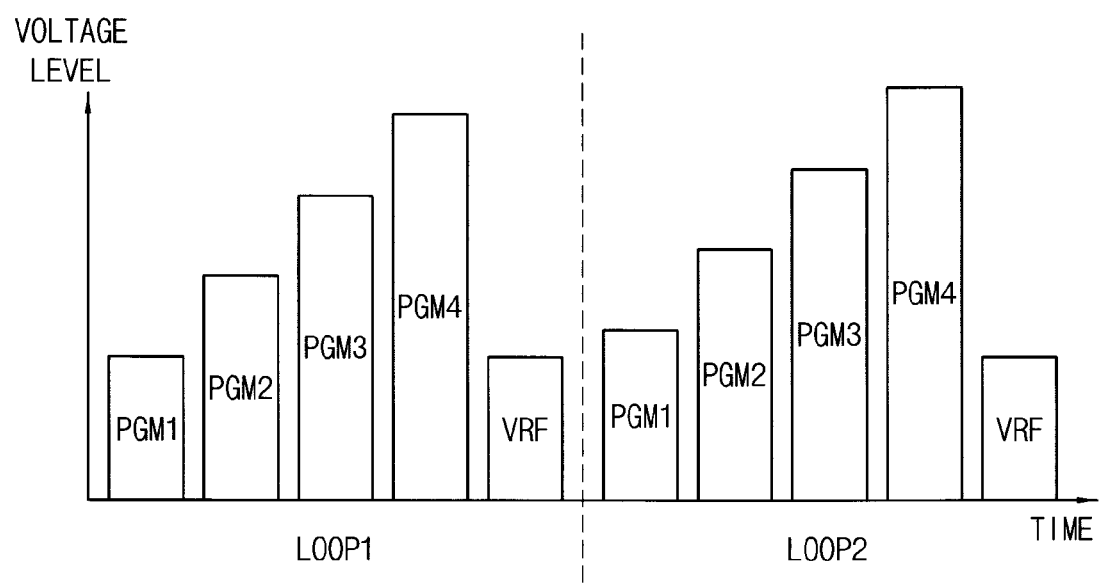
FIG. 21 is a diagram for describing an example of a second program operation or a third program operation of a program method according to example embodiments.

FIG. 21 is a diagram for describing an example of a second program operation or a third program operation of a program method according to example embodiments.

Referring to FIG. 21, a second program operation and/or a third program operation may be performed by applying different program voltages PGM1, PGM2, PGM3 and PGM4 to a plurality of groups by using cell group information generated during a first program operation.

Referring also to the example illustrated in FIG. 19, a first program voltage PGM1 may be applied to multi-level cells that belong to a first group GROUP1, a second program voltage PGM2 higher than the first program voltage PGM1 may be applied to multi-level cells that belong to a second group GROUP2, a third program voltage PGM3 higher than the second program voltage PGM2 may be applied to multi-level cells that belong to a third group GROUP3, and a fourth program voltage PGM4 higher than the third program voltage PGM3 may be applied to multi-level cells that belong to a fourth group GROUP4. In some example embodiments, each of the first through fourth program voltages PGM1, PGM2, PGM3 and PGM4 may be an incremental step pulse that increases by a predetermined step voltage per program loop.

Since the first program voltage PGM1, the second program voltage PGM2 higher than the first program voltage PGM1, the third program voltage PGM3 higher than the second program voltage PGM2, and the fourth program voltage PGM4 higher than the third program voltage PGM3 may be applied to the multi-level cells that belong to the first group GROUP1, the multi-level cells that belong to the second group GROUP2, the multi-level cells that belong to the third group GROUP3, and the multi-level cells that belong to the fourth group GROUP4 during the second program operation and/or the third program operation, respectively, the program operations for the first group GROUP1, the second group GROUP2, the third group GROUP3 and the four group GROUP4 may be completed at substantially the same time, and a program time of the second program operation and/or the third program operation may be reduced.

As described above, the second program operation and/or the third program operation according to example embodiments are performed by applying different program voltages according to the plurality of groups, thereby reducing the program time of the second program operation and/or the third program operation.

Figure 22:
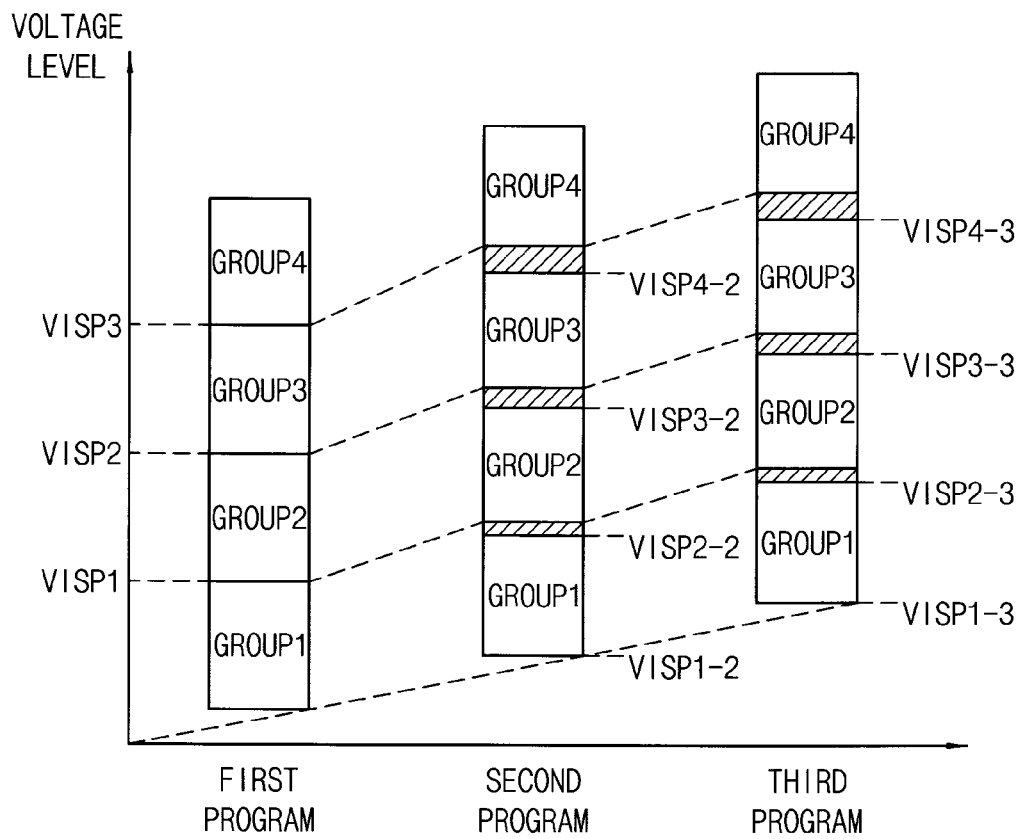
FIG. 22 is a diagram illustrating an example of program voltages that are applied during first through third program operations of a program method according to example embodiments.

FIG. 22 is a diagram illustrating an example of program voltages that are applied during first through third program operations of a program method according to example embodiments.

Referring to FIG. 22, during a first program operation, multi-level cells may be divided into a plurality of groups according to the number of program loops performed until each multi-level cell becomes an off-cell or according to a voltage level of an incremental step pulse at a program loop when each multi-level cell becomes the off-cell. For example, multi-level cells that are programmed by the incremental step pulse having a voltage level lower than a first voltage level VISP1 may be classified as a first group GROUP1, multi-level cells that are programmed by the incremental step pulse having a voltage level higher than the first voltage level VISP1 and lower than a second voltage level VISP2 may be classified as a second group GROUP2, multi-level cells that are programmed by the incremental step pulse having a voltage level higher than the second voltage level VISP2 and lower than a third voltage level VISP3 may be classified as a third group GROUP3, and multi-level cells that are programmed by the incremental step pulse having a voltage level higher than the third voltage level VISP3 and lower than a fourth voltage level VISP4 may be classified as a fourth group GROUP4.

During a second program operation, different incremental step pulses VISP1-2, VISP2-2, VISP3-2 and VISP4-2 may be applied to the plurality of groups GROUP1, GROUP2, GROUP3 and GROUP4. For example, a first incremental step pulse VISP1-2 may be applied to the first group GROUP1, a second incremental step pulse VISP2-2 higher than the first incremental step pulse VISP1-2 may be applied to the second group GROUP2, a third incremental step pulse VISP3-2 higher than the second incremental step pulse VISP2-2 may be applied to the third group GROUP3, and a fourth incremental step pulse VISP4-2 higher than the third incremental step pulse VISP3-2 may be applied to the fourth group GROUP4. Accordingly, the first through fourth groups GROUP1, GROUP2, GROUP3 and GROUP4 may be programmed at substantially the same time, and a program time of the second program operation may be reduced.

In some example embodiments, a voltage level difference between the first incremental step pulse VISP1-2 and the second incremental step pulse VISP2-2 may correspond to a voltage level difference between a start voltage level and the first voltage level VISP1 of the incremental step pulse of the first program operation, a voltage level difference between the second incremental step pulse VISP2-2 and the third incremental step pulse VISP3-2 may correspond to a voltage level difference between the first voltage level VISP1 and the second voltage level VISP2 of the incremental step pulse of the first program operation, and a voltage level difference between the third incremental step pulse VISP3-2 and the fourth incremental step pulse VISP4-2 may correspond to a voltage level difference between the second voltage level VIPS2 and the third voltage level VISP3 of the incremental step pulse of the first program operation. Alternatively, the second through third incremental step pulses VISP2-2, VISP3-2 and VISP4-2 may have voltage levels that are a step voltage or half the step voltage lower than the voltage levels determined as described above. In this case, widths of threshold voltage distributions of the second through fourth groups GROUP2, GROUP3 and GROUP4 may be further reduced.

During a third program operation, different incremental step pulses VISP1-3, VISP2-3, VISP3-3 and VISP4-3 may be applied to the plurality of groups GROUP1, GROUP2, GROUP3 and GROUP4. For example, a fifth incremental step pulse VISP1-3 may be applied to the first group GROUP1, a sixth incremental step pulse VISP2-3 higher than the fifth incremental step pulse VISP1-3 may be applied to the second group GROUP2, a seventh incremental step pulse VISP3-3 higher than the sixth incremental step pulse VISP2-3 may be applied to the third group GROUP3, and an eighth incremental step pulse VISP4-3 higher than the seventh incremental step pulse VISP3-3 may be applied to the fourth group GROUP4. Accordingly, the first through fourth groups GROUP1, GROUP2, GROUP3 and GROUP4 may be programmed at substantially the same time, and a program time of the third program operation may be reduced.

Figure 23:
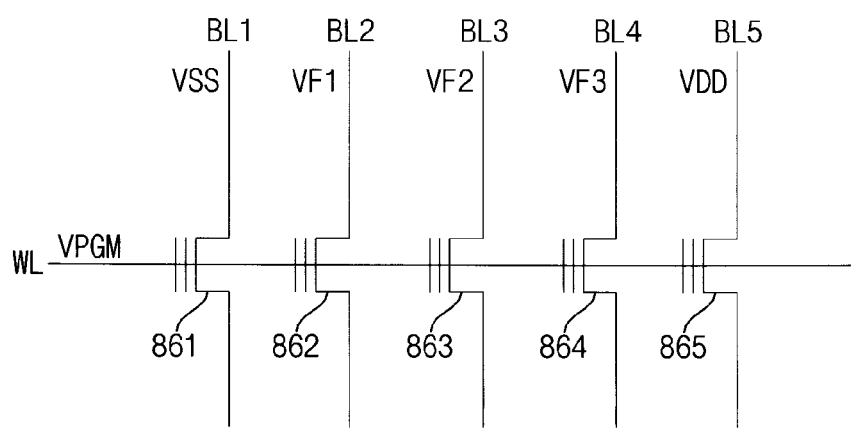
FIG. 23 is a diagram for describing another example of a second program operation or a third program operation of a program method according to example embodiments.

FIG. 23 is a diagram for describing another example of a second program operation or a third program operation of a program method according to example embodiments.

Referring to FIG. 23, a second program operation and/or a third program operation may be performed by applying different bitline voltages VSS, VF1, VF2 and VF3 to a plurality of groups by using cell group information generated during a first program operation.

Referring also to the example illustrated in FIG. 19, a third forcing voltage VF3 may be applied to bitlines BL4 coupled to multi-level cells 864 that belong to a first group GROUP1, a second forcing voltage VF2 lower than the third forcing voltage VF3 may be applied to bitlines BL3 coupled to multi-level cells 863 that belong to a second group GROUP2, a first forcing voltage VF1 lower than the second forcing voltage VF2 may be applied to bitlines BL2 coupled to multi-level cells 862 that belong to a third group GROUP3, and a voltage of a low level VSS lower than the first forcing voltage VF1 may be applied to bitlines BL1 coupled to multi-level cells 861 that belong to a fourth group GROUP4. A voltage of a high level VDD may be applied as a program inhibit voltage to bitlines BL5 coupled to multi-level cells 865 that are determined to be programmed during a verify operation or that are not to be programmed. Further, a program voltage VPGM may be applied to a wordline coupled to the multi-level cells 861, 862, 863, 864 and 865. Accordingly, an effective voltage of the program voltage VPGM for the third group GROUP3 may be lower than that of the program voltage VPGM for the fourth group GROUP4, the effective voltage of the program voltage VPGM for the second group GROUP2 may be lower than that of the program voltage VPGM for the third group GROUP3, and the effective voltage of the program voltage VPGM for the first group GROUP1 may be lower than that of the program voltage VPGM for the second group GROUP2.

As described above, the second program operation and/or the third program operation according to example embodiments may be performed by applying the different bitline voltages to the plurality of groups. Accordingly, the multi-level cells that belong to the plurality of groups may be programmed at substantially the same time, and a program time of the second program operation and/or the third program operation may be reduced.

Figure 24:
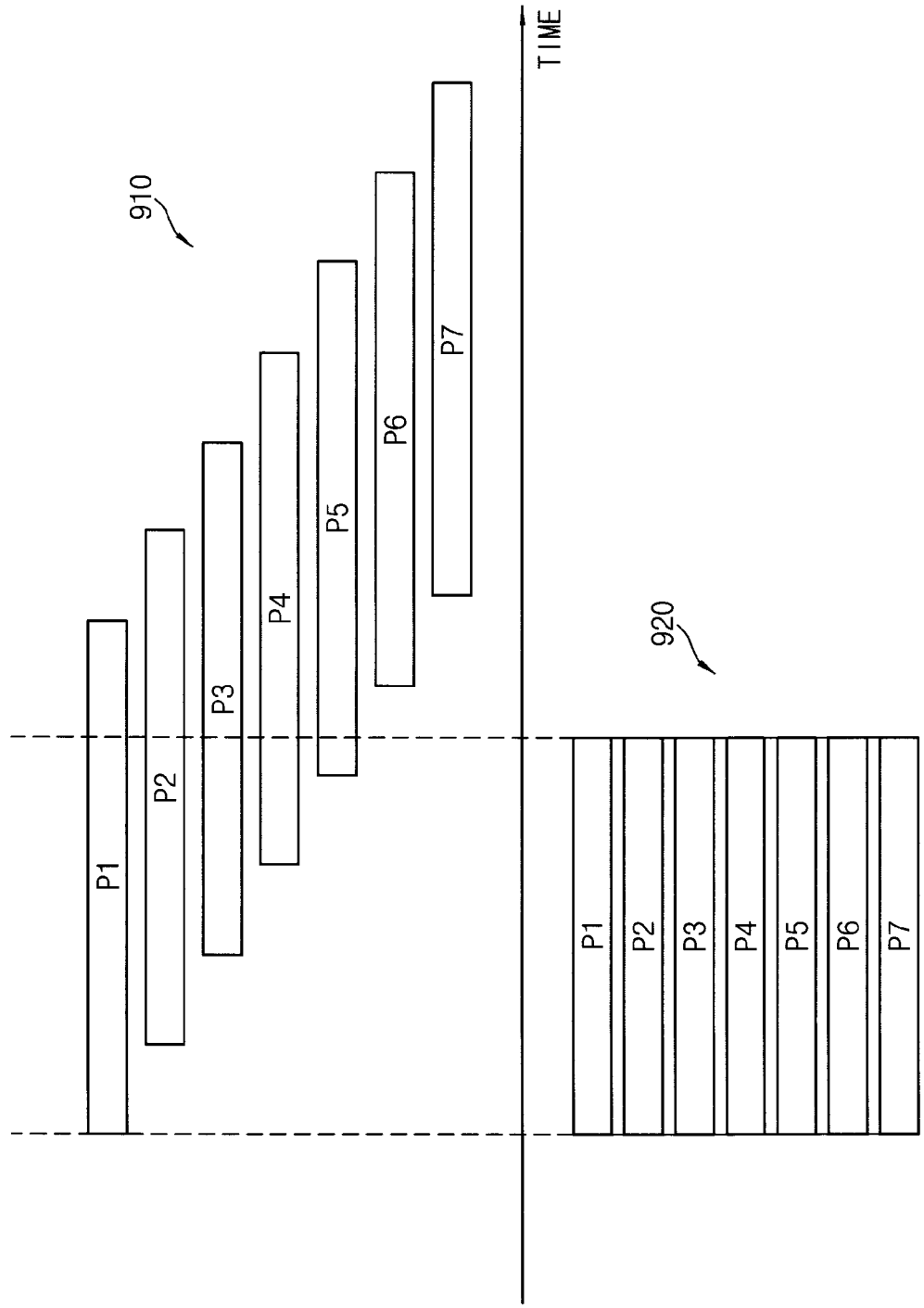
FIG. 24 is a diagram for describing a second/third program operation of a conventional program method and a second/third program operation of a program method according to example embodiments.

FIG. 24 is a diagram for describing a second/third program operation of a conventional program method and a second/third program operation of a program method according to example embodiments.

Referring to FIG. 24, in a second program operation or a third program operation 910 of a conventional nonvolatile memory device, multi-level cells of first through seventh program states P1, P2, P3, P4, P5, P6 and P7 may start to become off-cells at different program loops according to the program state, and program operations for the first through seventh program states P1, P2, P3, P4, P5, P6 and P7 may be completed at different program loops.

In contrast, in a second program operation or a third program operation 920 of a nonvolatile memory device according to example embodiments, multi-level cells of first through seventh program states P1, P2, P3, P4, P5, P6 and P7 may start to become off-cells at substantially the same program loop (e.g., an initial program loop), and program operations for the first through seventh program states P1, P2, P3, P4, P5, P6 and P7 may be completed at substantially the same program loop. Further, a program time for each program state P1, P2, P3, P4, P5, P6 and P7 may be reduced, and an overall program time also may be reduced.

Figure 25:
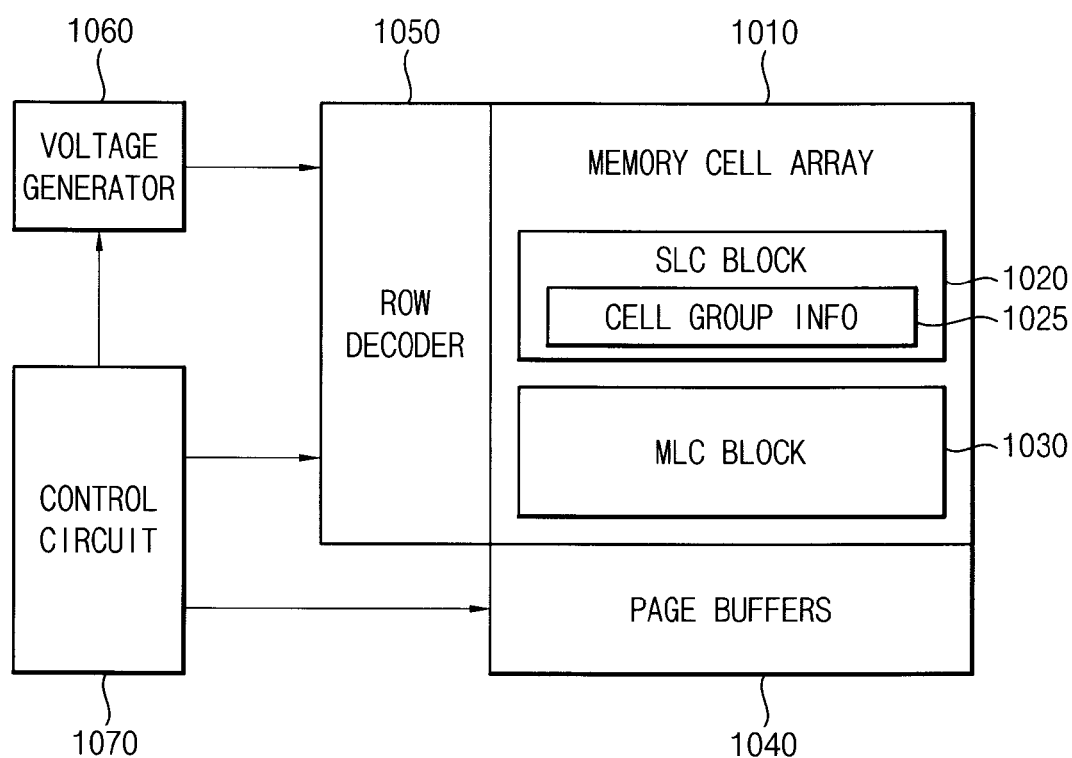
FIG. 25 is a block diagram illustrating a nonvolatile memory device according to example embodiments.

FIG. 25 is a block diagram illustrating a nonvolatile memory device according to example embodiments.

Referring to FIG. 25, a nonvolatile memory device 1000 includes a memory cell array 1010, a plurality of page buffers 1040, a row decoder 1050, a voltage generator 1060 and a control circuit 1070.

The memory cell array 1010 may include at least one multi-level cell block 1030. The multi-level cell block 1030 may include multi-level cells coupled to a plurality of wordlines and a plurality of bitlines. Each multi-level cell may store multi-bit data having two or more bits. The multi-bit data may be programmed to the multi-level cell block 1030 by a first program operation, a second program operation and a third program operation. Cell group information for the multi-level cells may be generated during the first program operation, and the second program operation and/or the third program operation may be performed based on the cell group information. Accordingly, the multi-level may have relatively narrow threshold voltage distributions, and a program time of the second program operation and/or the third program operation may be reduced. According to example embodiments, the multi-level cells may be implemented by one of various cell structures having a charge storing layer. For example, the cell structure may be a charge trap flash structure using a charge trap layer, a stack flash structure where arrays are stacked, a flash structure having no source-drain, a fin-type flash structure, and so on.

The memory cell array 1010 may further include at least one single level cell block 1020. In some example embodiments, the nonvolatile memory device 1000 may receive the multi-bit data from a host via a memory controller, and may program the multi-bit data to the signal level cell block 1020. Thereafter, the nonvolatile memory device 1000 may program the multi-bit data stored in the signal level cell block 1020 to the multi-level cell block 1030. That is, the nonvolatile memory device 1000 may perform an on-chip buffer program (OBP) that uses the signal level cell block 1020 as a buffer. In some example embodiments, the nonvolatile memory device 1000 may store the cell group information generated during the first program operation into at least one cell group information page 1025 included in the signal level cell block 1020, and may load the cell group information from the cell group information page 1025 into the plurality of page buffers 1040.

The plurality of page buffers 1040 may operate as write drivers or sense amplifiers according to operation modes. For example, the plurality of page buffers 1040 may operate as the sense amplifiers in a read mode, and may operate as the write drivers in a write mode. The plurality of page buffers 1040 may be coupled to the bitlines and temporarily store the multi-bit data. Each page buffer may include data storage latches that temporarily store the multi-bit data, and may further include at least one cell group information latch that temporarily stores the cell group information.

The row decoder 1050 may select a wordline in response to a row address. The row decoder 1050 may apply wordline voltages from the voltage generator 1060 to selected and non-selected wordlines. During a program operation, the row decoder 1050 may apply a program voltage to the selected wordline, and may apply a pass voltage to the non-selected wordlines.

The voltage generator 1060 may be controlled by the control circuit 1070 to generate the wordline voltages, such as the program voltage, the pass voltage, a verify voltage, a read voltage, and so on.

The control circuit 1070 may control the plurality of page buffers 1040, the row decoder 1050 and the voltage generator 1060 to program the multi-bit data to the memory cell array 1010.

The nonvolatile memory device 100 may generate the cell group information during the first program operation, and perform the second program operation and the third program operation based on the cell group information. Accordingly, the multi-level cells may have relatively narrow threshold voltage distributions, and a program time of the second program operation and/or the third program operation may be reduced.

Figure 26:
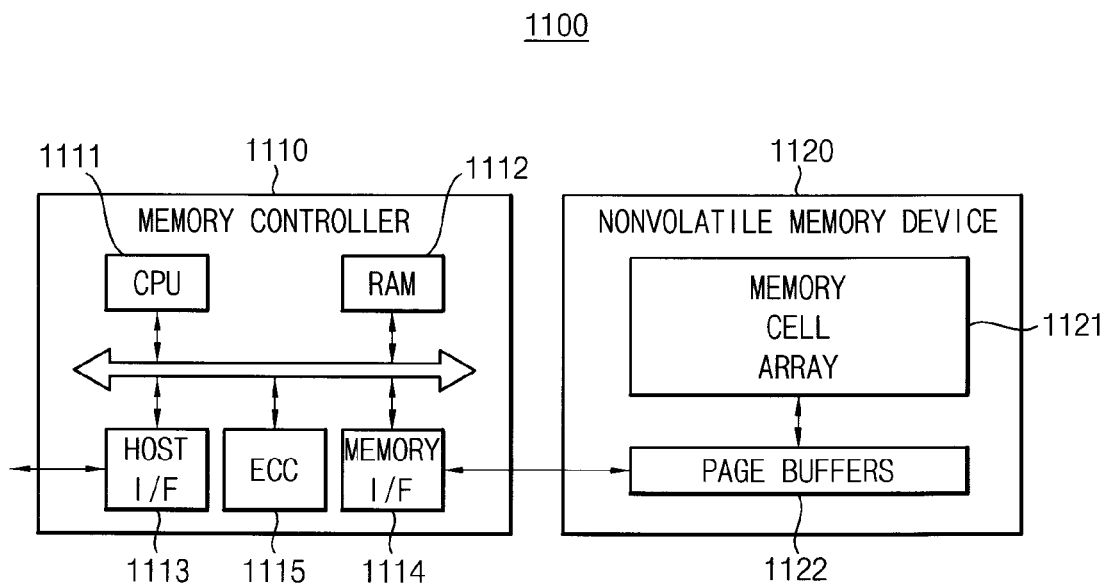
FIG. 26 is a block diagram illustrating a memory system according to example embodiments.

FIG. 26 is a block diagram illustrating a memory system according to example embodiments.

Referring to FIG. 26, a memory system 1100 includes a memory controller 1110 and a nonvolatile memory device 1120.

The nonvolatile memory device 1120 includes a memory cell array 1121 and a plurality of page buffers 1122. The plurality of page buffers 1122 may be coupled to bitlines, and may temporarily store multi-bit data. The memory cell array 1121 may include multi-level cells coupled to wordlines and the bitlines. Cell group information may be generated during a first program operation, and a second program operation and/or a third program operation may be performed based on the cell group information. Accordingly, the multi-level cells may have relatively narrow threshold voltage distributions, and a program time of the second program operation and/or the third program operation may be reduced.

The memory controller 1110 may control the nonvolatile memory device 1120. The memory controller 1110 may control data transfer between an external host (not shown) and the nonvolatile memory device 1120. The memory controller 1110 may include a central processing unit 1111, a buffer memory 1112, a host interface 1113 and a memory interface 1114. The central processing unit 1111 may perform operations for the data transfer. The buffer memory 1112 may be implemented by a dynamic random access memory (DRAM), a static random access memory (SRAM), a phase random access memory (PRAM), a ferroelectric random access memory (FRAM), a resistive random access memory (RRAM), a magnetic random access memory (MRAM), and so on. According to example embodiments, the buffer memory 1112 may be located internally or externally the memory controller 1110.

The host interface 1113 may be coupled to the host, and the memory interface 1114 may be coupled to the nonvolatile memory device 1120. The central processing unit 1111 may communicate with the host via the host interface 1113. For example, the host interface 1113 may be configured to communicate with the host using at least one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), and so on. Further, the central processing unit 1111 may communicate with the nonvolatile memory device 1120 via the memory interface 1114. In some example embodiments, the memory controller 1110 may further include an error correction block 1115 for error correction. According to example embodiments, the memory controller 1110 may be combined with the nonvolatile memory device 1120 in a single chip, or the memory controller 1110 and the nonvolatile memory device 1120 may be implemented as separate chips.

The memory system 1100 may be implemented as a memory card, a solid state drive, and so on. In some embodiments, the nonvolatile memory device 1120, the memory controller 1110 and/or the memory system 1100 may be packaged using any of a variety of packaging technologies, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 27:
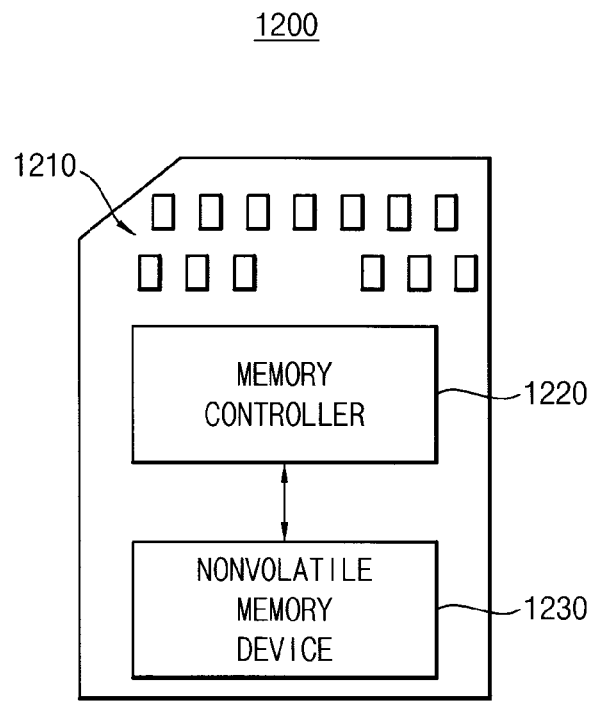
FIG. 27 is a diagram illustrating a memory card including a memory system according to example embodiments.

FIG. 27 is a diagram illustrating a memory card including a memory system according to example embodiments.

Referring to FIG. 27, a memory card 1200 may include a plurality of connecting pins 1210, a memory controller 1220 and a nonvolatile memory device 1230.

The connecting pins 1210 may be coupled to a host (not shown) to transfer signals between the host and the memory card 1200. The connecting pins 1210 may include a clock pin, a command pin, a data pin and/or a reset pin.

The memory controller 1220 may receive data from the host, and may store the received data in the nonvolatile memory device 1230.

The nonvolatile memory device 1230 may include multi-level cells. Cell group information for the multi-level cells may be generated during a first program operation, and a second program operation and/or a third program operation may be performed based on the cell group information. Accordingly, the multi-level cells may have relatively narrow threshold voltage distributions, and a program time of the second program operation and/or the third program operation may be reduced.

For example, the memory card 1200 may include a multi-media card (MMC), an embedded multimedia card (eMMC), a hybrid embedded multimedia card (hybrid eMMC), a secure digital (SD) card, a micro-SD card, a memory stick, an ID card, a personal computer memory card international association (PCMCIA) card, a chip card, a USB card, a smart card, a compact flash (CF) card, and so on.

In some embodiments, the memory card 1200 may be coupled to the host, such as a desktop computer, a laptop computer, a tablet computer, a mobile phone, a smart phone, a music player, a personal digital assistants (PDA), a portable multimedia player (PMP), a digital television, a digital camera, a portable game console, and so on.

Figure 28:
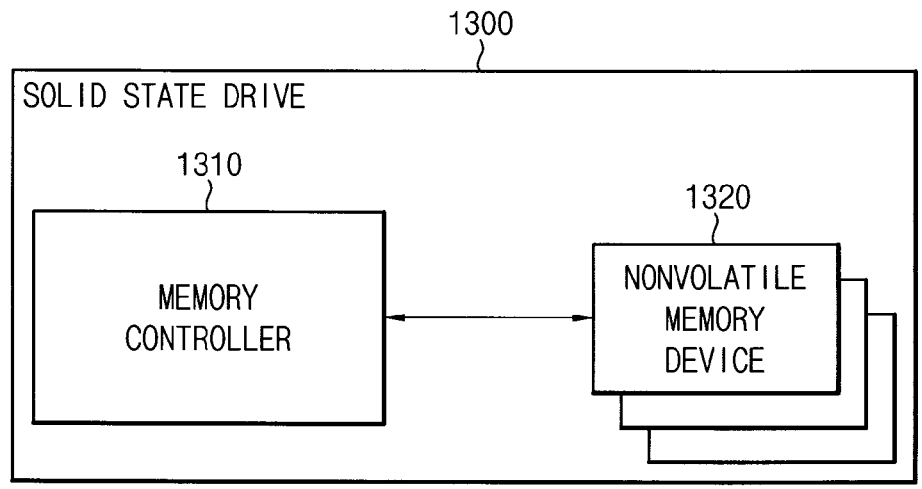
FIG. 28 is a diagram illustrating a solid state drive including a memory system according to example embodiments.

FIG. 28 is a diagram illustrating a solid state drive including a memory system according to example embodiments.

Referring to FIG. 28, a solid state drive (SSD) 1300 includes a memory controller 1310 and a plurality of nonvolatile memory devices 1320.

The memory controller 1310 may receive data from a host (not shown). The memory controller 1310 may store the received data in the plurality of nonvolatile memory devices 1320.

The plurality of nonvolatile memory devices 1320 may include multi-level cells. Cell group information for the multi-level cells may be generated during a first program operation, and a second program operation and/or a third program operation may be performed based on the cell group information. Accordingly, the multi-level cells may have relatively narrow threshold voltage distributions, and a program time of the second program operation and/or the third program operation may be reduced.

In some embodiments, the solid state drive 1300 may be coupled to the host, such as a mobile device, a mobile phone, a smart phone, a PDA, a PMP, a digital camera, a portable game console, a music player, a desktop computer, a notebook computer, a tablet computer, a speaker, a video, a digital television, and so on.

Figure 29:
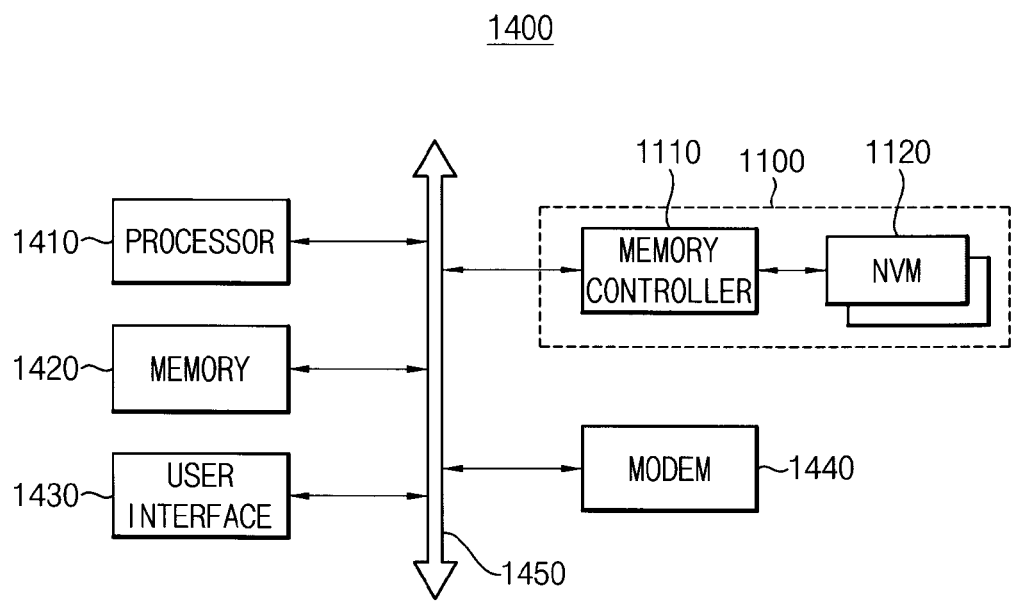
FIG. 29 is a diagram illustrating a computing system according to example embodiments.

FIG. 29 is a diagram illustrating a computing system according to example embodiments.

Referring to FIG. 29, a computing system 1400 includes a processor 1410, a memory device 1420, a user interface 1430 and a memory system 1100. In some embodiments, the computing system 1400 may further include a modem 1440, such as a baseband chipset.

The processor 1410 may perform specific calculations or tasks. For example, the processor 1410 may be a microprocessor, a central processing unit (CPU), a digital signal processor, or the like. The processor 1410 may be coupled to the memory device 1420 via a bus 1450, such as an address bus, a control bus and/or a data bus. For example, the memory device 1420 may be implemented by a DRAM, a mobile DRAM, a SRAM, a PRAM, a FRAM, a RRAM, a MRAM and/or a flash memory. Further, the processor 1410 may be coupled to an extension bus, such as a peripheral component interconnect (PCI) bus, and may control the user interface 1430 including at least one input device, such as a keyboard, a mouse, a touch screen, and so on, and at least one output device, a printer, a display device, and so on. The modem 1440 may perform wired or wireless communication with an external device. The nonvolatile memory device 1120 may be controlled by a memory controller 1110 to store data processed by the processor 1410 or data received via the modem 1440. In some embodiments, the computing system 1400 may further include a power supply, an application chipset, a camera image processor (CIS), and so on.

The inventive concept may be applied to any nonvolatile memory device including multi-level cells, and devices and systems including the nonvolatile memory device. For example, the inventive concept may be applied to various electronic devices, such as a memory card, a solid state drive, a desktop computer, a laptop computer, a tablet computer, a mobile phone, a smart phone, a music player, a PDA, a PMP, a digital television, a digital camera, a portable game console, and so on.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of programming a nonvolatile memory device, the method comprising:
    loading multi-bit data into a plurality of page buffers;
    programming multi-level cells included in a multi-level cell block to a plurality of intermediate program states based on the multi-bit data, the plurality of intermediate program states including a first intermediate program state and a second intermediate program state which is higher than the first intermediate program state;
    verifying whether the multi-level cells are programmed to the plurality of intermediate program states;
    generating cell group information for the first intermediate program state by checking whether a result of the verification for the second intermediate program state satisfies a predetermined criterion; and
    programming the multi-level cells to a plurality of target program states corresponding to the multi-bit data based on the cell group information.

2. The method of claim 1, wherein the predetermined criterion includes whether a number of off-cells of the second intermediate program state is greater than a predetermined value.

3. The method of claim 1, wherein the predetermined criterion includes whether a number of program loops performed after at least one multi-level cell of the second intermediate program state becomes an off-cell is greater than a predetermined value.

4. The method of claim 1, wherein the cell group information represents whether each of the multi-level cells belongs to a fast cell group including multi-level cells having threshold voltages which increase relatively fast and a slow cell group including multi-level cells having threshold voltages which increase relatively slowly.

5. The method of claim 4, wherein programming the multi-level cells to the plurality of target program states comprises:
    applying a first program voltage to the multi-level cells that belong to the fast cell group; and
    applying a second program voltage which is higher than the first program voltage to the multi-level cells that belong to the slow cell group.

6. The method of claim 4, wherein programming the multi-level cells to the plurality of target program states comprises:
    applying a voltage of a low level to bitlines coupled to the multi-level cells that belong to the slow cell group;
    applying a forcing voltage which is higher than the voltage of the low level to bitlines coupled to the multi-level cells that belong to the fast cell group; and
    applying a program voltage to a selected wordline.

7. The method of claim 1, wherein generating the cell group information comprises:
    counting off-cells having threshold voltages which are higher than a second intermediate verify voltage among the multi-level cells to be programmed to the second intermediate program state; and
    when a number of the counted off-cells is greater than a predetermined value, marking, as slow cells, on-cells having threshold voltages which are lower than a first intermediate verify voltage among the multi-level cells to be programmed to the first intermediate program state.

8. The method of claim 1, wherein generating the cell group information comprises:
    counting off-cells having threshold voltages which are higher than a second intermediate verify voltage among the multi-level cells to be programmed to the second intermediate program state; and
    when a number of the counted off-cells is greater than a predetermined value, marking, as fast cells, off-cells having threshold voltages which are higher than a first intermediate verify voltage among the multi-level cells to be programmed to the first intermediate program state.

9. The method of claim 1, wherein generating the cell group information comprises:
    counting off-cells having threshold voltages which are higher than a second intermediate verify voltage among the multi-level cells to be programmed to the second intermediate program state; and until a number of the counted off-cells becomes greater than a predetermined value, marking, as fast cells, off-cells having threshold voltages which are higher than a first intermediate verify voltage among the multi-level cells to be programmed to the first intermediate program state.

10. The method of claim 1, wherein generating the cell group information comprises:

counting program loops that are performed after at least one of the multi-level cells to be programmed to the second intermediate program state becomes an off-cell having a threshold voltage which is higher than a second intermediate verify voltage; and when a number of the counted program loops is greater than a predetermined value, marking, as slow cells, on-cells having threshold voltages which are lower than a first intermediate verify voltage among the multi-level cells to be programmed to the first intermediate program state.

11. The method of claim 1, further comprising programming the multi-bit data provided from a host to at least one single level cell block, wherein loading the multi-bit data into the plurality of page buffers comprises loading the multi-bit data from the at least one single level cell block into the plurality of page buffers.

12. The method of claim 11, further comprising:

programming the cell group information to the at least one single level cell block; and loading the multi-bit data and the cell group information from the at least one single level cell block into the plurality of page buffers to program the multi-level cells to the plurality of target program states.

* * * * *